(12) United States Patent
Park et al.

(10) Patent No.: US 12,217,699 B2
(45) Date of Patent: Feb. 4, 2025

(54) DISPLAY APPARATUS

(71) Applicant: Samsung Display Co., Ltd., Yongin-si (KR)

(72) Inventors: Gyungsoon Park, Yongin-si (KR); Sunhwa Lee, Yongin-si (KR); Hyunjoon Kim, Yongin-si (KR); Jaeyong Jang, Yongin-si (KR); Kyunghoon Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/502,554

(22) Filed: Nov. 6, 2023

(65) Prior Publication Data

US 2024/0071317 A1 Feb. 29, 2024

Related U.S. Application Data

(63) Continuation of application No. 18/089,790, filed on Dec. 28, 2022, now Pat. No. 11,830,439.

(30) Foreign Application Priority Data

Dec. 29, 2021 (KR) .................. 10-2021-0191839

(51) Int. Cl.
*G09G 3/3266* (2016.01)
*G09G 3/36* (2006.01)
*H10K 59/121* (2023.01)
*H10K 59/123* (2023.01)
*H10K 59/131* (2023.01)

(52) U.S. Cl.
CPC ......... *G09G 3/3266* (2013.01); *G09G 3/3677* (2013.01); *H10K 59/1213* (2023.02); *H10K 59/1216* (2023.02); *H10K 59/123* (2023.02); *H10K 59/131* (2023.02); *G09G 2310/0202* (2013.01)

(58) Field of Classification Search
CPC .............................. G09G 3/32; G09G 3/3233
See application file for complete search history.

(56) References Cited

U.S. PATENT DOCUMENTS

| | | | |
|---|---|---|---|
| 9,817,533 B2 | 11/2017 | Bulea et al. | |
| 10,510,301 B2 | 12/2019 | Na et al. | |
| 10,692,431 B2 | 6/2020 | Park | |
| 10,871,849 B2 | 12/2020 | Choi et al. | |
| 10,937,370 B2 | 3/2021 | Son | |
| 11,107,411 B1 | 8/2021 | Zhang et al. | |
| 11,990,502 B2 * | 5/2024 | Kawashima | G09G 3/32 |

(Continued)

FOREIGN PATENT DOCUMENTS

| | | |
|---|---|---|
| CN | 111341258 | 6/2020 |
| KR | 10-1637174 | 7/2016 |

(Continued)

*Primary Examiner* — Kevin M Nguyen
(74) *Attorney, Agent, or Firm* — KILE PARK REED & HOUTTEMAN PLLC

(57) ABSTRACT

A display apparatus includes a pixel part including a plurality of pixels, and a gate driving circuit. Each of the plurality of pixels is driven in one first scan period and one or more second scan periods during one frame in a driving mode driven at a first driving frequency lower than a maximum driving frequency.

21 Claims, 27 Drawing Sheets

(56) References Cited

U.S. PATENT DOCUMENTS

| | | | |
|---|---|---|---|
| 2012/0013597 A1* | 1/2012 | Han | ..................... G09G 3/3233 |
| | | | 345/212 |
| 2017/0039942 A1 | 2/2017 | Han et al. | |
| 2018/0174514 A1 | 6/2018 | Lee | |
| 2019/0156761 A1 | 5/2019 | Kim et al. | |
| 2020/0162704 A1 | 5/2020 | Ishii | |
| 2020/0183516 A1 | 6/2020 | Jang et al. | |
| 2021/0295779 A1 | 9/2021 | Kim et al. | |
| 2021/0312860 A1 | 10/2021 | Kim et al. | |
| 2022/0005403 A1* | 1/2022 | Yue | .......................... G09G 3/32 |
| 2022/0123075 A1 | 4/2022 | Kim et al. | |
| 2022/0140032 A1 | 5/2022 | Lee et al. | |

FOREIGN PATENT DOCUMENTS

| | | |
|---|---|---|
| KR | 10-2017-0105683 | 9/2017 |
| KR | 10-2019-0109692 | 9/2019 |
| KR | 10-2089317 | 3/2020 |
| KR | 10-2020-0057204 | 5/2020 |
| KR | 10-2020-0142646 | 12/2020 |
| KR | 10-2021-0013509 | 2/2021 |
| KR | 10-2216554 | 2/2021 |
| KR | 10-2261698 | 6/2021 |
| KR | 10-2022-0051097 | 4/2022 |
| KR | 10-2022-0060622 | 5/2022 |

\* cited by examiner

DISPLAY APPARATUS

CROSS-REFERENCE TO RELATED APPLICATION(S)

This is a continuation application of U.S. patent application Ser. No. 18/089,790, filed Dec. 28, 2022 (now pending), the disclosure of which is incorporated herein by reference in its entirety. U.S. patent application Ser. No. 18/089,790 claims priority to and benefits of Korean Patent Application No. 10-2021-0191839 under 35 U.S.C. § 119, filed Dec. 29, 2021, in the Korean Intellectual Property Office, the entire contents of which are incorporated herein by reference.

BACKGROUND

1. Technical Field

One or more embodiments relate to pixels and display apparatuses.

2. Description of the Related Art

Organic light-emitting display apparatuses include a display element, for example, an organic light-emitting diode emitting in a brightness that varies according to a current. A pixel of an organic light-emitting display apparatus includes a display element, a driving transistor that controls an amount of a current supplied to the display element according to a voltage between a gate and a source of the driving transistor, and a switching transistor that transmits, to the driving transistor, a data signal to control the brightness of the display element.

SUMMARY

One or more embodiments include display apparatuses in which a brightness difference for each driving frequency is reduced during driving of a pixel including oxide semiconductor transistors.

The technical objectives to be achieved by the disclosure are not limited to the above-described objectives, and other technical objectives that are not mentioned herein would be clearly understood by a person skilled in the art from the description of the disclosure.

Additional aspects will be set forth in part in the description which follows and, in part, will be apparent from the description, or may be learned by practice of the presented embodiments of the disclosure.

According to an aspect of the disclosure, a display apparatus includes a pixel part including a plurality of pixels, each of the plurality of pixels being electrically connected to a first scan line, a second scan line, a third scan line, a control line, and a data line, and a gate driving circuit that outputs first scan signal, a second scan signal, a third scan signal, and a control signal respectively through the first scan line, the second scan line, the third scan line, and the control line. Each of the plurality of pixels is driven in one first scan period and one or more second scan periods during one frame in a driving mode driven at a first driving frequency lower than a maximum driving frequency, and the gate driving circuit supplies the first scan signal and the third scan signal to the pixel part in the first scan period according to the first driving frequency, and supplies the second scan signal and the control signal to the pixel part in the first scan period and the one or more second scan periods according to the maximum driving frequency.

The length of each of the one or more second scan periods may be the length of the first scan period substantially equal to each other.

The first scan period may include a first non-light-emitting period and a first light-emitting period, and each of the one or more second scan periods may include a second non-light-emitting period and a second light-emitting period respectively corresponding to the first non-light-emitting period and the first light-emitting period.

In case that the first driving frequency is 1/n of the maximum driving frequency, the number of the one or more second scan periods is n−1, and n is a natural number.

Each of the plurality of pixels may include at least one transistor, the at least one transistor including a first transistor, a second transistor electrically connected between a gate of the first transistor and a data line, a gate of the second transistor being electrically connected to the first scan line, a third transistor electrically connected between the gate of the first transistor and a first voltage line, a gate of the third transistor being electrically connected to the third scan line, a fourth transistor electrically connected between a second terminal of the first transistor and a second voltage line, a gate of the fourth transistor being electrically connected to the second scan line, a fifth transistor electrically connected between a first terminal of the first transistor and a third voltage line, a gate of the fifth transistor being electrically connected to the control line, a first capacitor electrically connected between the gate and the second terminal of the first transistor, a second capacitor electrically connected between the third voltage line and the second terminal of the first transistor, and an organic light-emitting diode including an anode electrically connected to the second terminal of the first transistor.

Each of the first transistor to the fifth transistor may be an N-channel oxide semiconductor transistor.

The first scan period may include a first period in which the second scan signal and the third scan signal each have a voltage of a first level to turn at least one of the at least one transistor on, and the first scan signal and the control signal each have a voltage of a second level to turn at least one of the at least one transistor off, a second period in which the first scan signal and the second scan signal each have a voltage of the second level, and the third scan signal and the control signal each have a voltage of the first level, a third period in which the first scan signal has a voltage of the first level, and the second scan signal, the third scan signal, and the control signal each have a voltage of the second level, and a fourth period in which the first scan signal, the second scan signal, and the third scan signal each have a voltage of the second level, and the control signal has a voltage of the first level.

The one or more second scan periods may include a fifth period in which the second scan signal has a voltage of the first level to turn at least one of the at least one transistor on in a portion of a period in which the first scan signal, the third scan signal, and the control signal each have a voltage of the second level to turn at least one of the at least one transistor off.

The timing of the fifth period in the one or more second scan periods and the timing of the first period in the first scan period may be substantially identical to each other.

The first scan period may further include, between the third period and the fourth period, a sixth period in which the first scan signal, the third scan signal, and the control signal each have a voltage of the second level, and the second scan signal has a voltage of the first level, and the one or more second scan periods may further include, subsequent to the fifth period before the control signal is shifted from the second level to the first level, a seventh period in which the second scan signal has a voltage of the first level.

Each of the plurality of pixels may further include a third capacitor electrically connected between the second terminal of the first transistor and a fourth voltage line.

In the first scan period, a fourth voltage supplied through the fourth voltage line may be shifted from a high level to a low level before a start of the first period, and shifted from the low level to the high level after an end of the sixth period, and in the one or more second scan periods, the fourth voltage may be shifted from a high level to a low level before a start of the fifth period, and shifted from the low level to the high level after an end of the seventh period.

In the first scan period, a second voltage supplied through the second voltage line may be shifted from a high level to a low level before a start of the first period, and shifted from the low level to the high level before a start of the sixth period, and in the one or more second scan periods, the second voltage may be shifted from a high level to a low level before a start of the fifth period, and shifted from the low level to the high level before a start of the seventh period.

According to another aspect of the disclosure, a display apparatus includes a pixel part including a plurality of pixels, each of the plurality of pixels being electrically connected to a first scan line, a second scan line, a third scan line, a fourth scan line, a control line, and a data line, and a gate driving circuit that outputs a first scan signal, a second scan signal, a third scan signal, a fourth scan signal, and a control signal respectively through the first scan line, the second scan line, the third scan line, the fourth scan line, and the control line. Each of the plurality of pixels is driven in one first scan period and one or more second scan periods during one frame in a driving mode driven at a first driving frequency lower than a maximum driving frequency, and the gate driving circuit supplies the first scan signal and the third scan signal to the pixel part in the first scan period according to the first driving frequency, and supplies the fourth scan signal and the control signal to the pixel part in the first scan period and the one or more second scan periods according to the maximum driving frequency.

Each of the plurality of pixels may include at least one transistor, the at least one transistor including a first transistor, a second transistor electrically connected between a gate of the first transistor and a data line, a gate of the second transistor being electrically connected to the first scan line, a third transistor electrically connected between the gate of the first transistor and a first voltage line, a gate of the third transistor being electrically connected to the third scan line, a fourth transistor electrically connected between a second terminal of the first transistor and a second voltage line, a gate of the fourth transistor being electrically connected to the second scan line, a fifth transistor electrically connected between a first terminal of the first transistor and a third voltage line, a gate of the fifth transistor being electrically connected to the control line, a sixth transistor electrically connected between a second terminal of the first transistor and a fourth voltage line, a gate of the sixth transistor being electrically connected to the fourth scan line, a first capacitor electrically connected between the gate and the second terminal of the first transistor, a second capacitor electrically connected between the third voltage line and the second terminal of the first transistor, and an organic light-emitting diode including an anode electrically connected to the second terminal of the first transistor.

Each of the first transistor to the sixth transistor may be an N-channel oxide semiconductor transistor.

The first scan period may include a first period in which the second scan signal and the third scan signal each have a voltage of a first level to turn at least one of the at least one transistor on, and the first scan signal and the control signal each have a voltage of a second level to turn at least one of the at least one transistor off, a second period in which the first scan signal and the second scan signal each have a voltage of the second level, and the third scan signal and the control signal each have a voltage of the first level, a third period in which the first scan signal has a voltage of the first level, and the second scan signal, the third scan signal, and the control signal each have a voltage of the second level, a fourth period in which the first scan signal, the second scan signal, and the third scan signal each have a voltage of the second level, and the control signal has a voltage of the first level, and a sixth period, between the third period and the fourth period, in which the first scan signal, the second scan signal, the third scan signal, and the control signal each have a voltage of the second level, and the fourth scan signal has a voltage of the first level, The one or more second scan periods may include a fifth period in which the second scan signal has a voltage of the first level in a portion of a period in which the first scan signal, the third scan signal, the fourth scan signal, and the control signal each have a voltage of the second level, and subsequent to the fifth period before the control signal is shifted from the second level to the first level, a seventh period in which the fourth scan signal has a voltage of the first level.

The one or more second scan periods may include a seventh period in which the fourth scan signal has a voltage of the first level in a portion of a period in which the first scan signal, the second scan signal, the third scan signal, and the control signal each have a voltage of the second level.

The timing of the seventh period in the one or more second scan periods and the timing the sixth period in the first scan period may be substantially identical to each other.

The fourth scan line may be electrically connected to the second scan line in three or more neighboring rows, and the fourth scan signal may be a second scan signal supplied to the second scan line in the three or more neighboring rows.

Each of the plurality of pixels may further include a sixth transistor electrically connected between the first terminal of the first transistor and a fourth voltage line, a gate of the sixth transistor being electrically connected to the fourth scan line.

The one or more second scan periods may include a fifth period in which the second scan signal has a voltage of the first level in a portion of a period in which the first scan signal, the third scan signal, the fourth scan signal, and the control signal each have a voltage of the second level, and subsequent to the fifth period before the control signal is shafted from the second level to the first level, a seventh period in which the fourth scan signal has a voltage of the first level.

The one or more second scan periods may include a seventh period in which the fourth scan signal has a voltage of the first level in a portion of a period in which the first scan signal, the second scan signal, the third scan signal, and the control signal each have a voltage of the second level.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
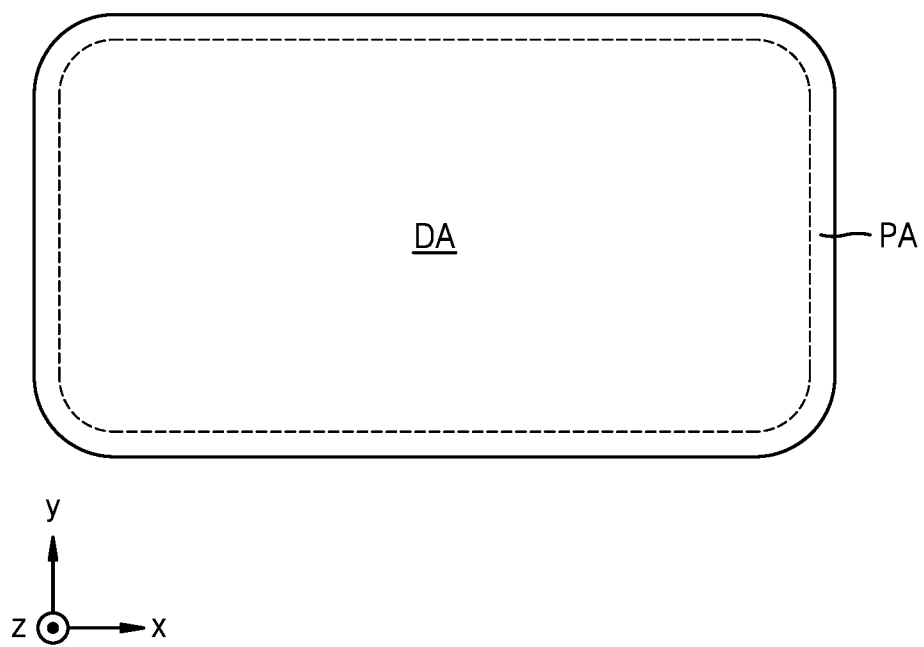
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. The term "and/or" includes all combinations of one or more of which associated configurations may define. For example, "A and/or B" may be understood to mean "A, B, or A and B." The phrase "at least one of" is intended to include the meaning of "at least one selected from the group of" for the purpose of its meaning and interpretation. For example, "at least one of A and B" may be understood to mean "A, B, or A and B."

Various modifications may be applied to the embodiments, and particular embodiments will be illustrated in the drawings and described in the detailed description section. The effect and features of the embodiments, and a method to achieve the same, will be clearer referring to the detailed descriptions below with the drawings. However, the embodiments may be implemented in various forms, not by being limited to the embodiments presented below.

In the following embodiments, it will be understood that although the terms "first," "second," and the like may be used herein to describe various elements, these elements should not be limited by these terms. These elements are only used to distinguish one element from another.

In the following embodiments, as used herein, the singular forms "a," "an" and "the" are intended to include the plural forms (or meanings) as well, unless the context clearly indicates otherwise.

In the following embodiments, it will be further understood that the terms "comprises," "includes," and/or their variants used herein specify the presence of stated features or elements, but do not preclude the presence or addition of one or more other features or elements.

In the following embodiments, it will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. For example, since sizes and thicknesses of elements in the drawings are arbitrarily illustrated for convenience of explanation, the following embodiments are not limited thereto.

In an embodiment, the meaning that the wiring "extends in the first direction or the second direction" includes not only extending in a linear shape, but also extending in a zigzag or a curve along the first direction or the second direction.

In the following embodiments, when X and Y are connected to each other, it may include a case in which X and Y are electrically connected, a case in which X and Y are functionally connected, and a case in which X and Y are directly connected. Here, X and Y may be objects, for example, apparatuses, devices, circuits, wirings, electrodes, terminals, conductive films, layers, etc. Accordingly, a certain connection relationship, for example, is not limited to the connection relationship described in the drawings or detailed descriptions, and may include things other than the connection relationship described in the drawings or detailed descriptions.

A case in which X and Y are electrically connected to each other may include, for example, a case in which one or more elements, for example, switches, transistors, capacitors, inductors, resistors, diodes, etc., which enable the electric connection between X and Y, is connected between X and Y.

In the following embodiments, the term "ON" used in connection with a device state may refer to an activated state of the device, and the term "OFF" may refer to an inactive state of the device. The term "On" used in connection with a signal received by a device may refer to a signal that activates the device, and the term "OFF" may refer to a signal that deactivates the device. A device can be activated by a high level voltage or a low level voltage. For example, a P-channel transistor is activated by a low level voltage, and an N-channel transistor is activated by a high level voltage. Accordingly, it should be understood that the "ON" voltages for a P-channel transistor and an N-channel transistor are at opposite (low vs. high) voltage levels.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view illustrating a portion of a display apparatus according to an embodiment. A display apparatus according to the disclosure may include a display panel as illustrated in FIG. 1. The display apparatus may include any display apparatus including a display panel. For example, the display apparatus may be various products such as smartphones, tablet personal computers (PCs), laptops, televisions, billboards, and the like. The display panel may include a display area DA and a peripheral area PA outside the display area DA.

The display area DA is a portion for displaying an image, and pixels may be arranged in the display area DA. When viewed from a direction (Z-axis direction) approximately perpendicular to the display panel, the display area DA may have various shapes, for example, an oval shape, a polygonal shape, a shape of a specific figure, and the like. FIG. 1 illustrates that the display area DA has an approximately rectangular shape with round corners. The display panel included in the display apparatus according to the disclosure has the display area DA having a shape in which a length in a second direction (X-axis direction) that is the horizontal direction is greater than a length in a first direction (Y-axis direction) that is the vertical direction. The display panel including the display area DA having such a shape may be interpreted such that a substrate included in the display panel include the display area DA having such a shape. Various driving circuits may be located in the peripheral area PA of the display panel.

Figure 2:
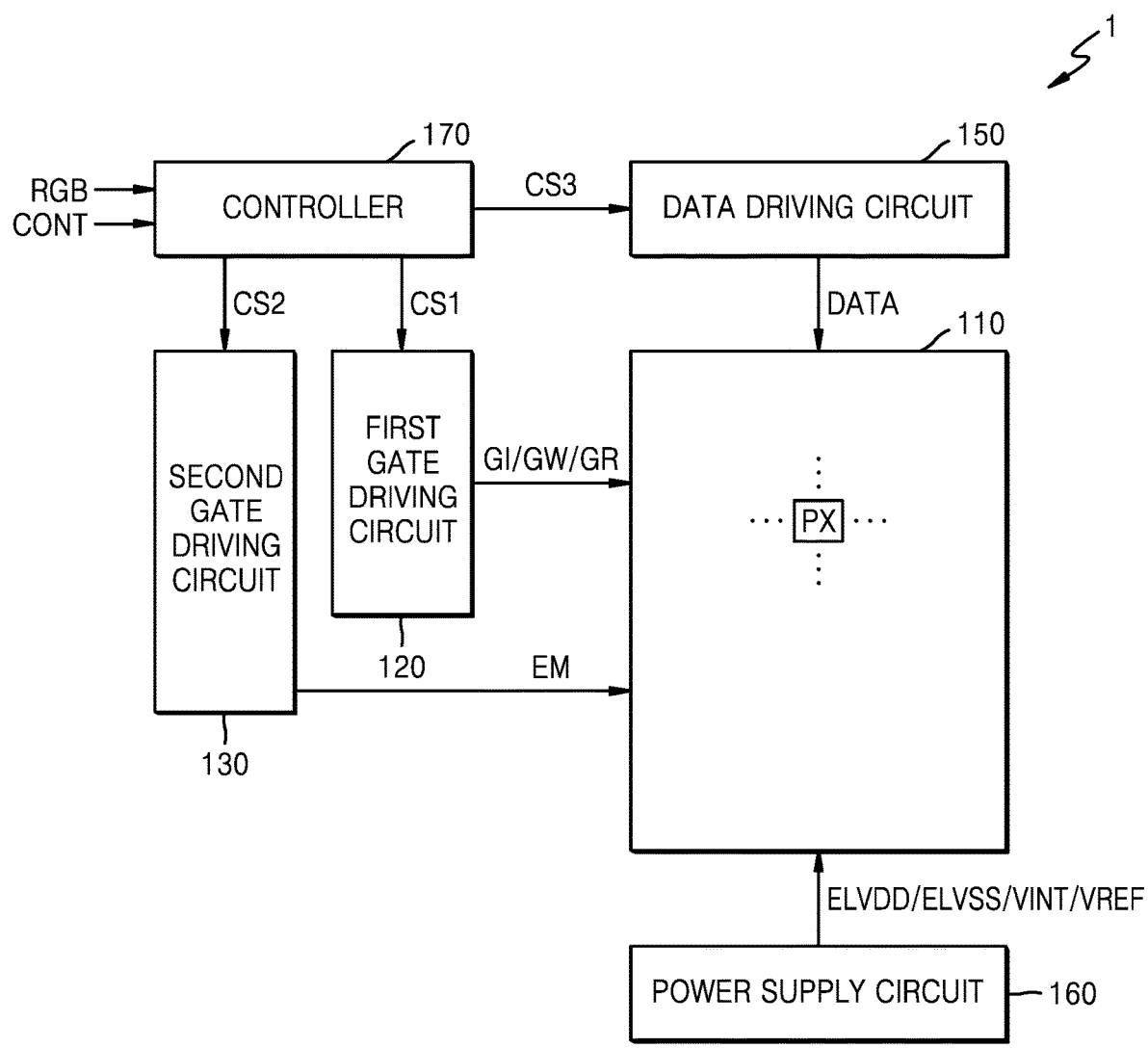
FIG. 2 is a schematic block diagram of a display apparatus according to an embodiment.

FIG. 2 is a schematic block diagram of a display apparatus 1 according to an embodiment.

Referring to FIG. 2, the display apparatus 1 according to an embodiment may include a pixel part 110, a first gate driving circuit 120, a second gate driving circuit 130, a data driving circuit 150, a power supply circuit 160, and a controller 170.

The pixel part 110 of the display apparatus 1 may be provided in the display area DA of FIG. 1. The peripheral area PA (see FIG. 1) of the display apparatus 1 may be provided with the first gate driving circuit 120, the second gate driving circuit 130, the data driving circuit 150, the power supply circuit 160, and the controller 170.

Pixels PX may be disposed in the pixel part 110. The pixels PX may be arranged in various shapes such as a stripe arrangement, a PenTile® arrangement, a mosaic arrangement, and the like, to provide an image. The pixel part 110 may be disposed in the display area DA of the substrate. Each pixel PX may include an organic light-emitting diode as a display element, and a pixel circuit connected to the organic light-emitting diode. Each pixel PX may emit, for example, red, green, blue, or white light through the organic light-emitting diode.

First scan lines, second scan lines, and third scan lines, and light-emitting control lines may be spaced apart from each other at regular intervals and arranged in rows in the pixel unit 110. The first scan lines, second scan lines, third scan lines, and light-emitting control lines may each extend in a first direction, for example, a row direction and may be connected to the pixels PX located in a same row. Each of the first scan lines may transmit a first scan signal GW to the pixels PX in a same row. Each of the second scan lines may transmit a second scan signal GI to the pixels PX in a same row. Each of the third scan lines may transmit a third scan signal GR to the pixels PX in a same row. Each of the light-emitting control lines may transmit a light-emitting control signal EM to the pixels PX in a same row. Data lines may be spaced apart from each other at regular intervals and arranged in columns in the pixel part 110. Each of the data lines may extend in a second direction, for example, a column direction, and may be connected to the pixels PX located in a same column. Each of the data lines may transmit data signals DATA to the pixels PX in a same column.

The display apparatus 1 may support a variable refresh rate (VRR). The display apparatus 1 may operate by changing a driving frequency within a range between the maximum driving frequency and the minimum driving frequency. In the following description, it is assumed that a mode in which the display apparatus 1 operates at the maximum driving frequency is referred to as a normal mode (first driving mode), and a mode in which the display apparatus 1 operates at a driving frequency (first driving frequency) lower than the maximum driving frequency is referred to as a low-speed driving mode (second driving mode). The display apparatus 1 may operate in a low-speed driving mode for reduction of power consumption. Each of the pixels PX may be driven in the first driving mode or the second driving mode.

The first gate driving circuit 120 may be connected to the first scan lines, the second scan lines, and the third scan lines of the pixel part 110, and may supply, in response to a first control signal CS1, the first scan signal GW, the second scan signal GI, and the third scan signal GR to the first scan lines, the second scan lines, and the third scan lines, respectively. In case that the first scan signal GW, the second scan signal GI, and the third scan signal GR have an ON voltage, a transistor of the pixel PX connected to the corresponding scan line is turned on. In the second driving mode, the first gate driving circuit 120 may supply the first scan signal GW and the third scan signal GR to the pixel part 110 according to the first driving frequency, and the second scan signal GI to the pixel part 110 according to the maximum driving frequency.

The second gate driving circuit 130 may be connected to light-emitting control lines of the pixel part 110, and may supply the light-emitting control signal EM to the light-emitting control lines according to a second control signal CS2. In the second driving mode, the second gate driving circuit 130 may supply the light-emitting control signal EM to the pixel part 110 according to the maximum driving frequency.

The data driving circuit 150 may be connected to the data lines of the pixel part 110, and may supply the data signal DATA, expressing gradation, to the data lines according to a third control signal CS3. The data driving circuit 150 may convert input image data, having gradation and input from the controller 170, to the data signal DATA in the form of a voltage or a current.

The power supply circuit 160 may generate voltages needed for driving of the pixel PX. For example, the power supply circuit 160 may generate a first driving voltage ELVDD, a second driving voltage ELVSS, a reference voltage VREF, and an initialization voltage VINT. The power supply circuit 160 may supply the first driving voltage ELVDD, the second driving voltage ELVSS, the reference voltage VREF, and the initialization voltage VINT to the pixels PX of the pixel part 110.

A level of the first driving voltage ELVDD may be greater than a level of the second driving voltage ELVSS. A level of the reference voltage VREF may be less than a level of the first driving voltage ELVDD. The initialization voltage VINT may be a voltage that enables the organic light-emitting diode to be turned off. In an embodiment, the level of the initialization voltage VINT may be lower than or equal to the level of the second driving voltage ELVSS. In an embodiment, a level of an initialization voltage VINT may be greater than a level of the second driving voltage ELVSS, and a level difference between the initialization voltage VINT and the second driving voltage ELVSS may be less than a threshold voltage that is necessary to enable the display element of the pixel PX to emit light.

The controller 170 may control the pixel part 110 by controlling the operation timing of the first gate driving circuit 120, the second gate driving circuit 130, and the data driving circuit 150. The controller 170 may receive image data RGB and a control signal CONT to control the display of the image data RGB, from an external graphics controller (not shown). The control signal CONT may include, for example, at least one of a vertical synchronous signal, a horizontal synchronous signal, a data enable signal, and a clock signal. The controller 170 may generate the first to the third control signals CS1, CS2, and CS3 in response to the control signal CONT, and transmit the generated first to the third control signals CS1, CS2, and CS3 to the first gate driving circuit 120, the second gate driving circuit 130, and the data driving circuit 150, respectively. The image data RGB may include brightness information of the pixels PX. The brightness may have a set number, for example, 1024 ($=2^{10}$), 256 ($=2^8$), or 64 ($=2^6$) gradations (gray).

Although FIG. 1 illustrates that the first gate driving circuit 120 and the second gate driving circuit 130 are separated from each other, in an embodiment, the first gate driving circuit 120 and the second gate driving circuit 130 may be implemented as a gate driving circuit to output the first scan signal GW, the second scan signal GI, the third scan signal GR, and the light-emitting control signal EM.

The first gate driving circuit 120, the second gate driving circuit 130, the data driving circuit 150, the power supply circuit 160, and the controller 170 may be formed in the form of separate integrated circuit chips or an integrated circuit chip and mounted directly on a substrate where the pixel part 110 is formed, mounted on a flexible printed circuit film, attached on the substrate in the form of a tape carrier package (TCP), or the first gate driving circuit 120, the second gate driving circuit 130, the data driving circuit 150, the power supply circuit 160, and the controller 170 may be formed directly on the substrate.

Figure 3:
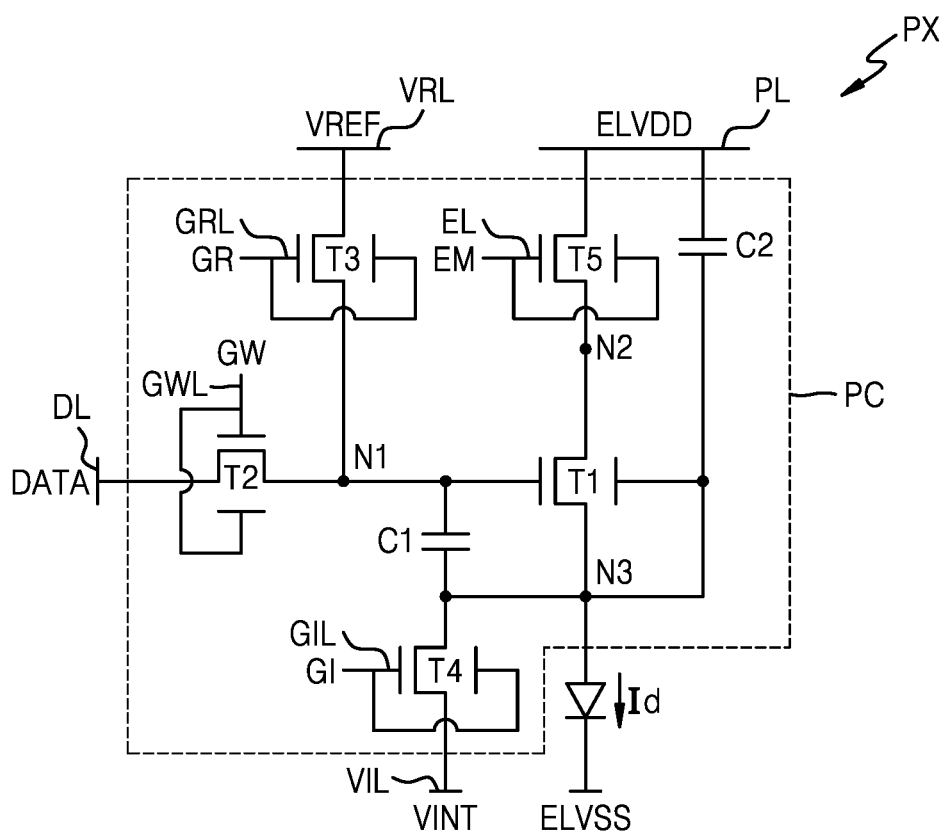
FIG. 3 is a schematic diagram of an equivalent circuit of a pixel circuit of a pixel, according to an embodiment.

FIG. 3 is a schematic circuit diagram of a pixel circuit PC of the pixel PX, according to an embodiment.

Referring to FIG. 3, the pixel PX may include the organic light-emitting diode as the display element and the pixel circuit PC connected to the organic light-emitting diode. The pixel circuit PC may include first to fifth transistors T1 to T5 and first and second capacitors C1 and C2. The first transistor T1 may be a driving transistor in which the amount of a source-drain current is determined according to a gate-source voltage, and the second to fifth transistors T2 to T5 may be switching transistors that are turned on/off according to the gate-source voltage, that is, substantially a gate voltage. The first to fifth transistors T1 to T5 may be implemented as thin-film transistors. According to the type (p-type or n-type) and/or the operating conditions of a transistor, a first terminal of each of the first to fifth transistors T1 to T5 may be a source or a drain, and a second terminal thereof may be a terminal that is different from the first terminal. For example, in case that the first terminal is a source, the second terminal may be a drain.

The pixel PX may be connected to a first scan line GWL for transmitting the first scan signal GW, a second scan line GIL for transmitting the second scan signal GI, a third scan line GRL for transmitting the third scan signal GR, a light-emitting control line EL for transmitting the light-emitting control signal EM, and a data line DL for transmitting the data signal DATA. A driving voltage line PL may be configured to transmit the first driving voltage ELVDD to the first transistor T1. An initialization voltage line VIL may be configured to transmit the initialization voltage VINT to the organic light-emitting diode. A reference voltage line VRL may be configured to transmit the reference voltage VREF to a gate of the first transistor T1.

The first to fifth transistors T1 to T5 may include an oxide semiconductor material. As an oxide semiconductor has high carrier mobility and a low leakage current, even in case that a driving time is long, a voltage drop is not much. In other words, for the oxide semiconductor, as a color change of an image due to a voltage drop during low frequency driving is not much, the low frequency driving is possible. Accordingly, as the first to fifth transistors T1 to T5 include an oxide semiconductor material, a display apparatus in which generation of a leakage current is prevented and simultaneously consumption power is reduced may be implemented. Furthermore, in case that an oxide semiconductor transistor is used, it is advantageous to implement a display apparatus having a large size because the manufacturing cost of a display panel may be reduced without a crystallization process by excimer laser annealing (ELA) to form a low-temperature polycrystalline silicon (LTPS) semiconductor transistor.

The oxide semiconductor is sensitive to light, and a current amount and the like may be changed by external light. Accordingly, it may be considered to absorb or reflect light from the outside by placing a metal layer under the oxide semiconductor. A metal layer placed under the oxide semiconductor of the first to fifth transistors T1 to T5 may function as a lower gate (gate electrode). In other words, the first to fifth transistors T1 to T5 may be double gate transistors having two gates (a first gate and a second gate). The first gate and the second gate may be disposed on different layers to face each other. For example, each of the first to fifth transistors T1 to T5 may be an N-channel oxide semiconductor transistor, and the first gate and the second gate of each of the first to fifth transistors T1 to T5 may be located to face each other with the oxide semiconductor therebetween.

The first transistor T1 may include a first gate connected to a first node N1, a second gate connected to a third node N3, a first terminal connected to a second node N2, and a second terminal connected to the third node N3. The second gate of the first transistor T1 may be connected to the second terminal of the first transistor T1 and controlled by a voltage applied to the second terminal of the first transistor T1, and may improve the output saturation characteristics of the first transistor T1. The first terminal of the first transistor T1 may be connected to the driving voltage line PL via the fifth transistor T5, and the second terminal thereof may be connected to a pixel electrode of the organic light-emitting diode. The first transistor T1 may serve as a driving transistor, and receive the data signal DATA according to the switching operation of the second transistor T2 and control the amount of a driving current Id flowing to the organic light-emitting diode.

The second transistor T2 (data write transistor) may include a first gate and a second gate connected to the first scan line GWL, a first terminal connected to the data line DL, and a second terminal connected to the first node N1 (or the first gate of the first transistor T1). The second transistor T2 may be turned on by the first scan signal GW transmitted through the first scan line GWL to electrically connect the data line DL with the first node N1, and may transmit the data signal DATA, transmitted through the data line DL, to the first node N1.

The third transistor T3 (first initialization transistor) may include a first gate and a second gate connected to the third scan line GRL, a first terminal connected to the reference voltage line VRL, and a second terminal connected to the first node N1 (or the first gate of the first transistor T1). The third transistor T3 may be turned on by the third scan signal GR transmitted through the third scan line GRL, and may transmit the reference voltage VREF, transmitted through the reference voltage line VRL, to the first node N1.

The fourth transistor T4 (second initialization transistor) may include a first gate and a second gate connected to the second scan line GIL, a first terminal connected to the third node N3 (or the second terminal of the first transistor T1), and a second terminal connected to the initialization voltage line VIL. The fourth transistor T4 may be turned on by the second scan signal GI transmitted through the second scan line GIL and may transmit the initialization voltage VINT, transmitted through the initialization voltage line VIL, to the third node N3.

The fifth transistor T5 (e.g., a light-emitting control transistor) may include a first gate and a second gate connected to the light-emitting control line EL, a first terminal connected to the driving voltage line PL, and a second terminal connected to the second node N2 (or the first terminal of the first transistor T1). The fifth transistor T5 may be turned on or off by the light-emitting control signal EM transmitted through the light-emitting control line EL.

The first capacitor C1 may be connected between the first node N1 and the third node N3. A first terminal of the first capacitor C1 may be connected to the first gate of the first transistor T1, and a second terminal thereof may be connected to the second gate and the second terminal of the first transistor T1, the first terminal of the fourth transistor T4, and the pixel electrode of the organic light-emitting diode. The first capacitor C1, as a storage capacitor, may store a threshold voltage (Vth) of the first transistor T1 and a voltage corresponding to the data signal DATA.

The second capacitor C2 may be connected between the third node N3 and the driving voltage line PL. A first terminal of the second capacitor C2 may be connected to the driving voltage line PL, and a second terminal thereof may be connected to the second gate and the second terminal of the first transistor T1, the second terminal of the first capacitor C1, the first terminal of the fourth transistor T4, and the pixel electrode of the organic light-emitting diode. The capacitance of the first capacitor C1 may be greater than the capacitance of the second capacitor C2.

The organic light-emitting diode may include a pixel electrode (anode) and a counter electrode (cathode) facing the pixel electrode, and the counter electrode may receive the second driving voltage ELVSS. The counter electrode may be a common electrode that is common to the pixels PX.

Figure 4:
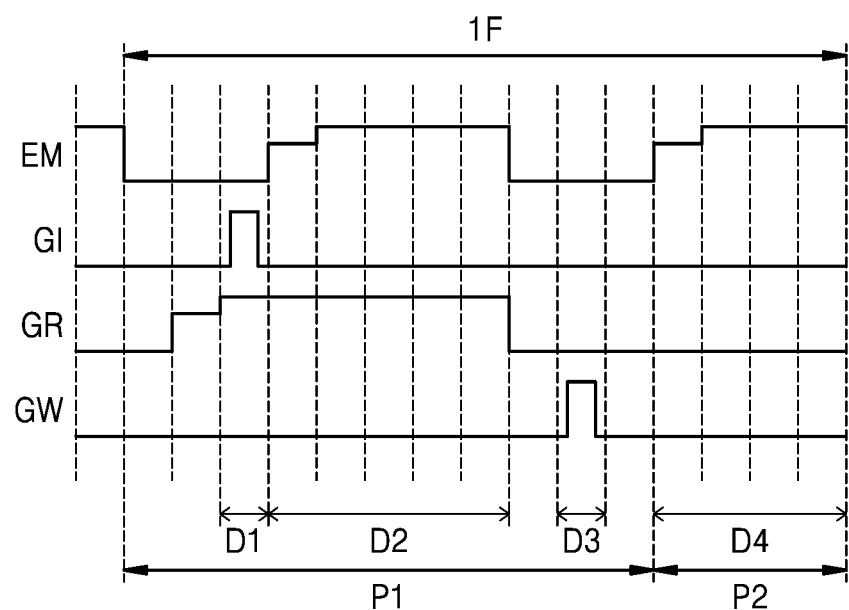
FIG. 4 is a schematic timing diagram of control signals to operate the pixel circuit of FIG. 3.

FIG. 4 is a schematic timing diagram of control signals to operate the pixel circuit PC of FIG. 3. Descriptions are presented below with reference to FIGS. 3 and 4.

The pixel PX may operate by dividing one frame into first to fourth periods D1 to D4 in the first driving mode. Hereinbelow, the first to third periods D1 to D3 are a first non-light-emitting period P1 during which a pixel does not emit light, and a fourth period D4 is a first light-emitting period P2 during which a pixel emits light.

The second scan signal GI may be supplied, as an ON voltage, during the first period D1. The first scan signal GW may be supplied, as an ON voltage, during the third period D3. In other words, a period in which the second scan signal GI has an ON voltage may be ahead of a period in which the first scan signal GW has an ON voltage. The third scan signal GR may be supplied, as an ON voltage, during the first period D1 and the second period D2. The light-emitting control signal EM may be supplied as an OFF voltage during the first period D1 and the third period D3, and as an ON voltage during the second period D2 and the fourth period D4. The pulse widths of the first scan signal GW, the second scan signal GI, and the third scan signal GR may be an ON voltage maintenance period. The pulse width of the light-emitting control signal EM may be a period having an OFF voltage. The ON voltage may be a transistor turn-on voltage that is a voltage of a low level.

The first driving voltage ELVDD may be supplied through the driving voltage line PL, the reference voltage VREF may be supplied through the reference voltage line VRL, and the initialization voltage VINT may be supplied through the initialization voltage line VIL.

The first period D1 may be an initialization period in which the first node N1, to which the first gate of the first transistor T1 is connected, and the third node N3, to which the pixel electrode (anode) of the organic light-emitting diode is connected, are initialized.

In the first period D1, the second scan signal GI having an ON voltage may be supplied though the second scan line GIL, and the third scan signal GR having an ON voltage may be supplied through the third scan line GRL. The first scan signal GW and the light-emitting control signal EM may be supplied as OFF voltages. The ON voltage of the second scan signal GI may have a width of about a horizontal scanning period (H).

The fourth transistor T4 may be turned on by the second scan signal GI, and the third transistor T3 may be turned on by the third scan signal GR. As the third transistor T3 is turned on, the reference voltage VREF may be supplied to the first node N1, for example, the gate of the first transistor T1. As the fourth transistor T4 is turned on, the third node N3, for example, the pixel electrode of the organic light-emitting diode, may be set to the initialization voltage VINT. Accordingly, as a capacitor (not shown) parasitically formed in the organic light-emitting diode is discharged, the organic light-emitting diode may be initialized.

The second period D2 may be a compensation period for compensating for the threshold voltage of the first transistor T1. In the second period D2, the first scan signal GW may maintain an OFF voltage, the second scan signal GI may be shifted to an OFF voltage, the third scan signal GR may maintain an ON voltage, and the light-emitting control signal EM may be shifted to an ON voltage.

As the third scan signal GR having an ON voltage is supplied through the third scan line GRL in the second period D2, the third transistor T3 may be turned on, and as the light-emitting control signal EM having an ON voltage is supplied through a light-emitting control line EML, the fifth transistor T5 may be turned on. Accordingly, as the reference voltage VREF is supplied to the first node N1 and the first driving voltage ELVDD is supplied to the second node N2, the first transistor T1 is turned on, and in case that a voltage of the second terminal of the first transistor T1 drops below a difference (VREF-Vth) between the reference voltage VREF and the threshold voltage (Vth) of the first transistor T1, the first transistor T1 may be turned off. The first capacitor C1 may be charged with a voltage corresponding to the threshold voltage (Vth) of the first transistor T1.

The third period D3 may be a data write period in which the data signal DATA is supplied to the pixel PX. In the third period D3, the second scan signal GI may maintain an OFF voltage, the third scan signal GR and the light-emitting control signal EM are shifted to an OFF voltage, and the first scan signal GW may be shifted to an ON voltage. The ON voltage of the first scan signal GW may have a width of about a horizontal scanning period 1H.

As the first scan signal GW having an ON voltage is supplied through the first scan line GWL in the third period D3, the second transistor T2 may be turned on. In this state, the second scan signal GI, the third scan signal GR, and the light-emitting control signal EM, which are OFF voltages, may turn off the third to fifth transistors T3, T4, and T5.

The second transistor T2 may transmit the data signal DATA from the data line DL to the first node N1, for example, the first gate of the first transistor T1. Accordingly, the voltage of the first node N1 may be changed from the reference voltage VREF to a voltage corresponding to the data signal DATA. In this state, the voltage of the second node N2 may be changed according to a change amount of the voltage of the first node N1. The voltage of the second node N2 may be changed according to a capacitance ratio between the first capacitor C1, the second capacitor C2, and a parasitic capacitor of the organic light-emitting diode. Accordingly, the first capacitor C1 may be charged with the threshold voltage (Vth) of the first transistor T1 and the voltage corresponding to the data signal DATA.

The fourth period D4 may be a period in which the organic light-emitting diode emits light. As the light-emitting control signal EM is shifted to an ON voltage in the fourth period D4, the first scan signal GW, the second scan signal GI, and the third scan signal GR may be OFF voltages.

In the fourth period D4, the first scan signal GW, the second scan signal GI, and the third scan signal GR, which are OFF voltages, may turn off the second to fourth transistors T2, T3, and T4, the light-emitting control signal EM having an ON voltage may turn on the fifth transistor T5, and thus, the first driving voltage ELVDD may be supplied to the second node N2.

The first transistor T1 may output a driving current $(Id \propto (Vgs-Vth)^2)$ having an amount corresponding to a voltage stored in the first capacitor C1, in other words, a voltage (Vgs-Vth) obtained by deducting the threshold voltage (Vth) of the first transistor T1 from the gate-source voltage (Vgs) of the first transistor T1 (a voltage between the first node N1 and the third node N3), and the organic light-emitting diode may emit light of a brightness corresponding to the amount of the driving current Id that is irrelevant to the threshold voltage (Vth) of the first transistor T1.

Figure 5:
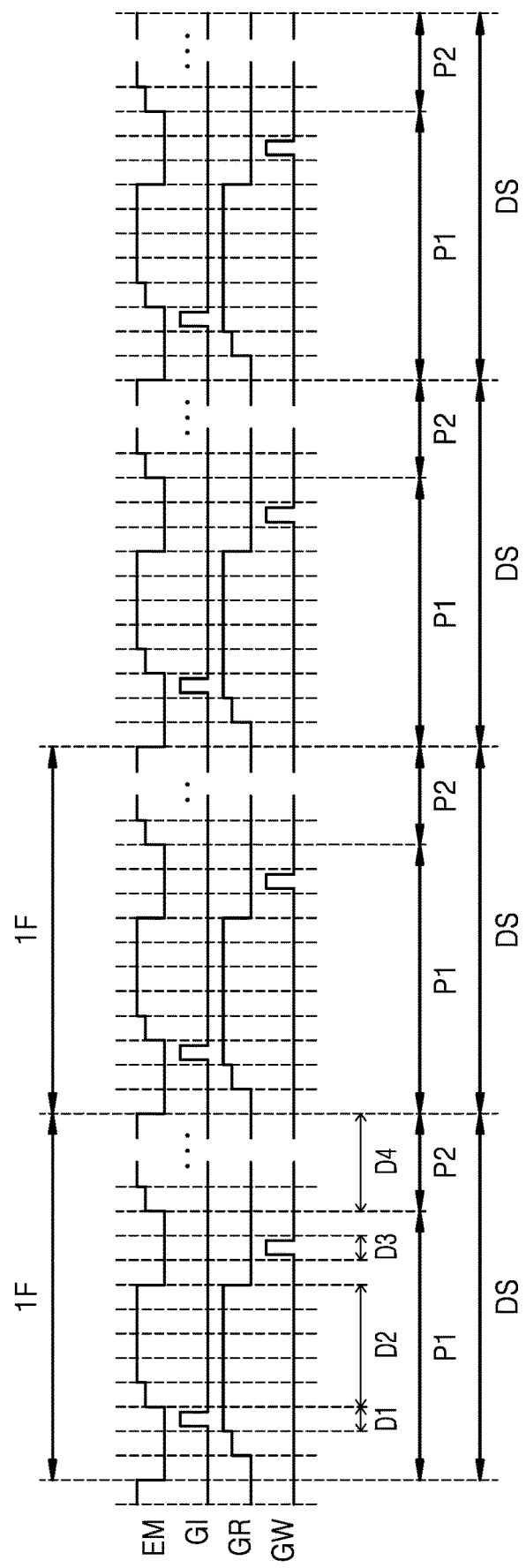
FIG. 5 is a schematic timing diagram of control signals in a first driving mode, according to an embodiment.
Figure 6:
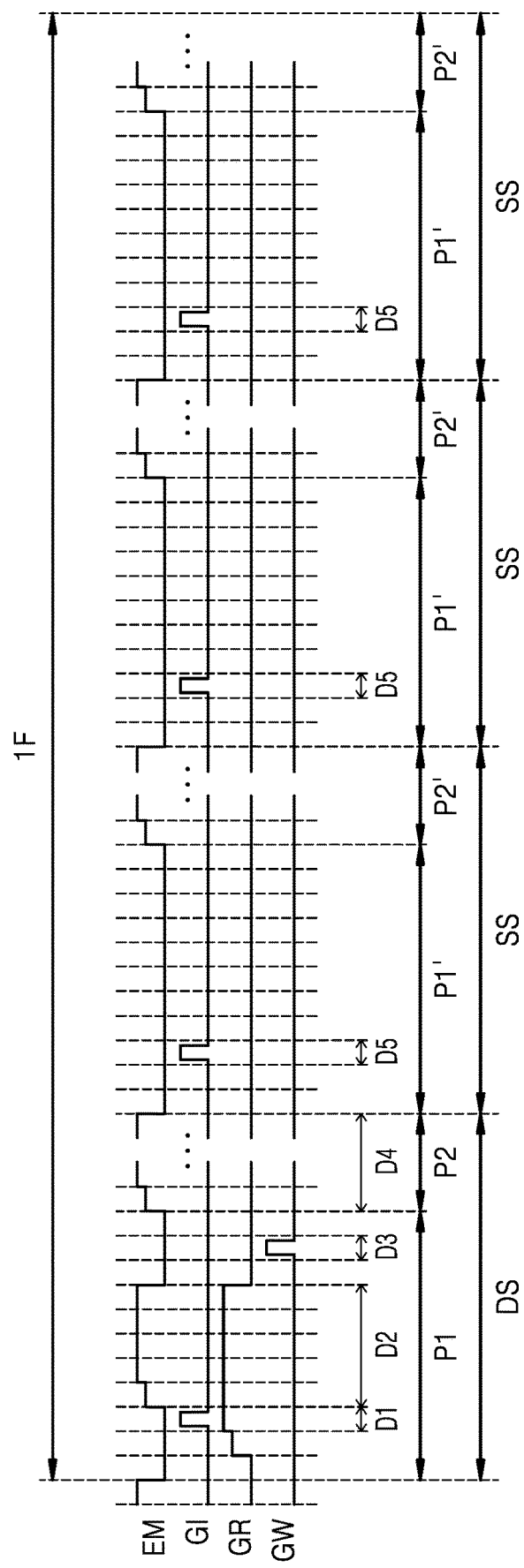
FIG. 6 is a schematic timing diagram of control signals in a second driving mode, according to an embodiment.
Figure 7:
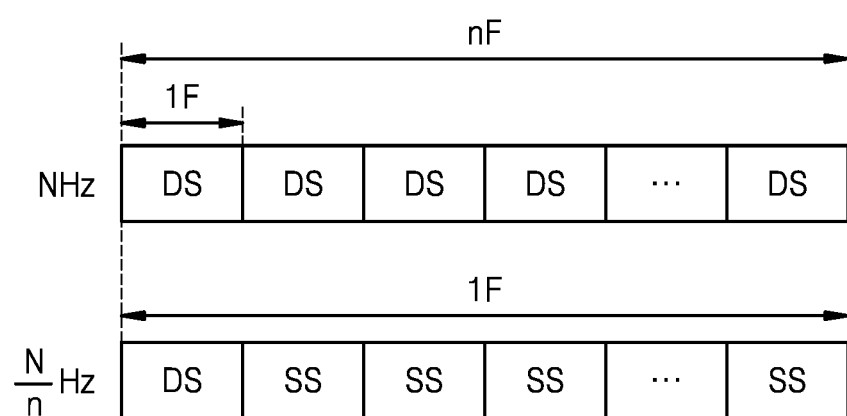
FIG. 7 is a schematic conceptual view illustrating an example of a method of driving a display apparatus according to a driving frequency in the first driving mode and the second driving mode.

FIG. 5 is a schematic timing diagram of control signals in a first driving mode, according to an embodiment. FIG. 6 is a schematic timing diagram of control signals in a second driving mode, according to an embodiment. FIG. 7 is a schematic conceptual view illustrating an example of a method of driving a display apparatus according to a driving frequency in the first driving mode and the second driving mode. Descriptions are presented below with reference to FIGS. 5 to 7. FIGS. 5 and 6 are schematic timing diagrams illustrating an example of a display apparatus having a maximum driving frequency of about 120 Hz and a first driving frequency of about 30 Hz.

Referring to FIG. 5, in case that the display apparatus is driven at about 120 Hz, a frame 1F may include a first scan period DS, and the first scan period DS may include the first non-light-emitting period P1 and the first light-emitting period P2. The first scan period DS may be defined as a display scan period in which a data signal is written, and accordingly, a pixel emits light.

Referring to FIG. 6, in case that the display apparatus is driven at about 30 Hz, the frame 1F may include a first scan period DS and three second scan periods SS. The second scan period SS may include a second non-light-emitting period P1' and a second light-emitting period P2'. The second scan period SS may be defined as a self-scan period in which a data signal is not written, the data signal written in the first scan period DS is maintained, and a pixel emits light.

The second scan period SS may include a fifth period D5 in a period (or partial period) of the second non-light-emitting period P1'. In the fifth period D5, the first scan signal GW, the third scan signal GR, and the light-emitting control signal EM may be supplied as OFF voltages, and the second scan signal GI may be supplied as an ON voltage.

In the fifth period D5, the first scan signal GW, the third scan signal GR, and the light-emitting control signal EM, which are OFF voltages, may turn off the second transistor T2, the third transistor T3, and the fifth transistor T5, the second scan signal GI having an ON voltage may turn on the fourth transistor T4, and thus the initialization voltage VINT may be supplied to the third node N3. In the fifth period D5, the organic light-emitting diode may not emit light.

The length of the second scan period SS may be the same as the length of the first scan period DS. The second non-light-emitting period P1' and the second light-emitting period P2' may correspond to the timing of the first non-light-emitting period P1 and the first light-emitting period P2, respectively. In the second non-light-emitting period P1', the light-emitting control signal EM may be an OFF voltage, and the pulse width of the OFF voltage may be the same as the first non-light-emitting period P1. For example, as illustrated in FIG. 6, the first non-light-emitting period P1 of the first scan period DS is 11H (i.e., 11×H), and the second non-light-emitting period P1' of the second scan period SS, for example, the pulse width of an OFF voltage of the light-emitting control signal EM is 11H. The timing of the first period D1 in the first non-light-emitting period P1 of the first scan period DS may be the same as the timing of the fifth period D5 in the second non-light-emitting period P1' of the second scan period SS.

In case that the display apparatus is driven in the first driving mode, the frame 1F may include the first scan period DS, and in case that the display apparatus is driven in the second driving mode, the frame 1F may include the first scan period DS and one or more second scan periods SS. Referring to FIG. 7, in case that the maximum driving frequency is N Hz, the first driving frequency is N/n Hz (n≥2), and in the second driving mode, the frame 1F may include a first scan period DS and (n−1) second scan periods SS. For example, in case that the maximum driving frequency about 480 Hz, and the first driving frequency is about 240 Hz, in the second driving mode, the frame 1F may include a first scan period DS and a second scan period SS, and in case that the first driving frequency is about 30 Hz, in the second driving mode, the frame 1F may include a first scan period DS and fifteen (15) second scan periods SS. In case that the maximum driving frequency is about 120 Hz, and the first driving frequency is about 1 Hz, in the second driving mode, the frame 1F may include a first scan period DS and one hundred and nineteen (119) second scan periods SS.

Figure 8:
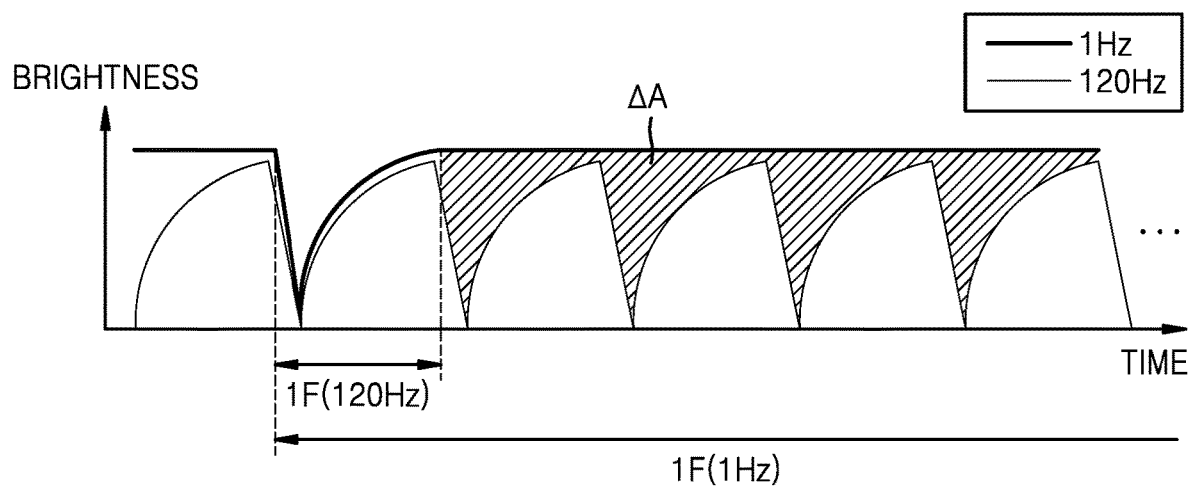
FIGS. 8 and 9 are graphs showing examples of light waveforms by brightness measurement of a display apparatus.
Figure 9:
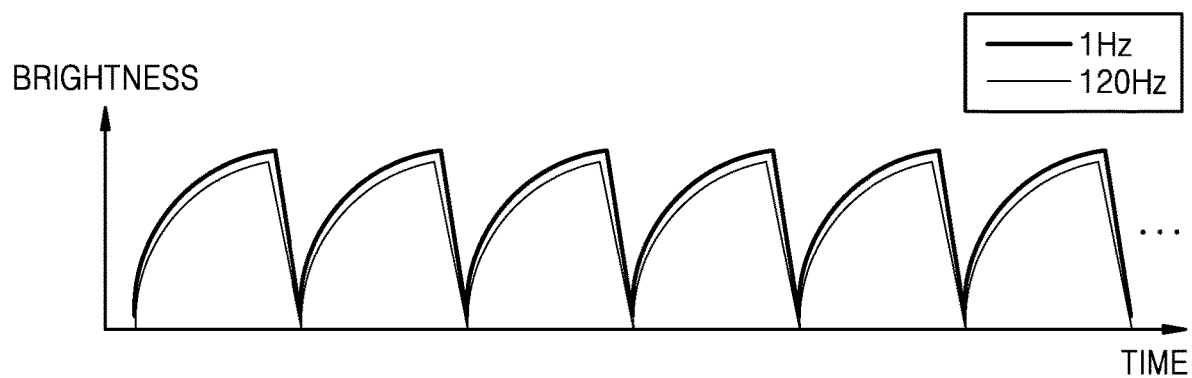

FIGS. 8 and 9 are schematic graphs illustrating examples of light waveforms by brightness measurement of a display apparatus FIG. 8 illustrates an example of a change in brightness of a light waveform measured by a display apparatus that is driven according to the timing diagram of FIG. 4 in each of the first driving mode and the second driving mode. FIG. 9 illustrates an example of a change in brightness of a light waveform measured by a display apparatus that is driven according to the timing diagrams of FIGS. 5 and 6 in the first driving mode and the second driving mode. An example in which the maximum driving frequency is about 120 Hz and the first driving frequency is about 1 Hz is described below.

Referring to FIG. 8, in the first driving mode, as the organic light-emitting diode does not emit light in the first to third periods D1 to D3, the brightness expressed by the pixel PX may be decreased, and in case that the fifth transistor T5 is turned on after the data signal DATA is applied thereto, the organic light-emitting diode starts emitting light so that the brightness expressed by the pixel PX may be increased. For example, for 120 Hz driving, a data signal is applied 120 times per second, and a non-light-emitting period may appear 120 times. In the second driving mode, for 1 Hz driving, as a data signal is applied once per second, a non-light-emitting period may appear once. Accordingly, a brightness difference corresponding to a light waveform area difference (ΔA) may be generated between the 120 Hz driving and the 1 Hz driving.

Referring to FIG. 9, in the second driving mode, for 1 Hz driving, according to the application of a data signal once per second, a first non-light-emitting period P1 and one hundred and nineteen (119) second non-light-emitting periods P1' per second may appear. Furthermore, by inserting the fifth period D5 into the second non-light-emitting period P1' corresponding to the first period D1 of the first non-light-emitting period P1 to initialize the anode of the organic light-emitting diode, light waveforms of the 120 Hz driving and the 1 Hz driving are approximately matched with each other so that driving may be made without a brightness difference for each driving frequency.

Hereinafter, a redundant description is omitted, and only a difference therebetween is described.

Figure 10:
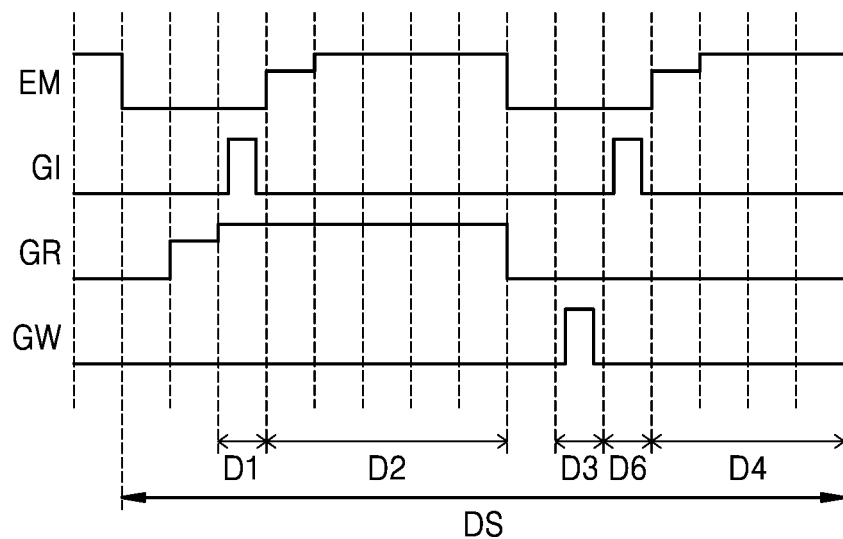
FIG. 10 shows schematic timing diagrams of control signals in the second driving mode, according to another embodiment.
Figure 10:
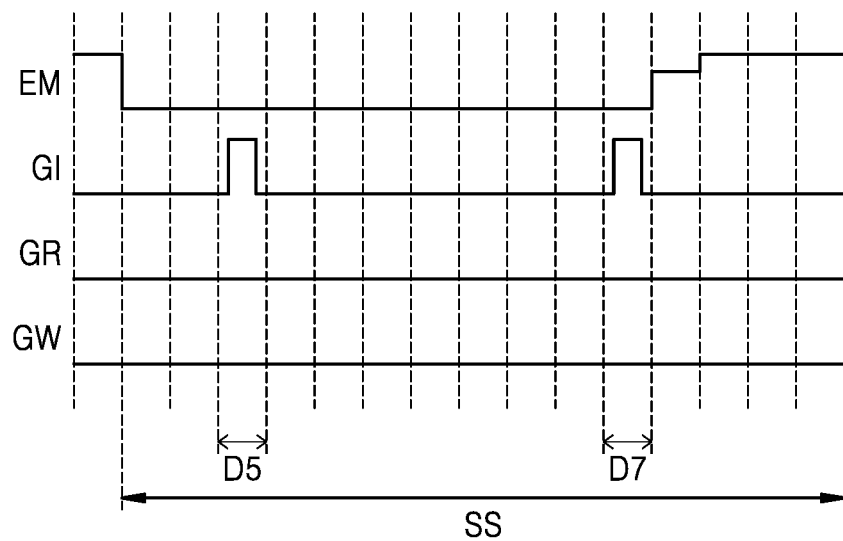

FIG. 10 illustrates schematic timing diagrams of control signals in the second driving mode, according to another embodiment. In FIG. 10, an upper timing diagram is the timing diagram of the first scan period DS, and a lower timing diagram is the timing diagram of the second scan period SS. The timing diagram of the first scan period DS illustrated in FIG. 10 may be applied to the timing diagram of the first scan period DS in the first driving mode.

Referring to FIG. 10, the first scan period DS may include the first to fourth periods D1 to D4, and further include a sixth period D6. The second scan period SS may include the fifth period D5, and further include a seventh period D7. The timing of the sixth period D6 of first scan period DS may be the same as the timing of the seventh period D7 of the second scan period SS.

The sixth period D6 of first scan period DS may be included between the third period D3 and the fourth period D4. The sixth period D6 may be inserted after data writing to a pixel and before light emission. In the sixth period D6, as the first scan signal GW, the third scan signal GR, and the light-emitting control signal EM are supplied as OFF voltages, and the second scan signal GI is supplied as an ON voltage, the fourth transistor T4 may be turned on and the third node N3 may be initialized to the initialization voltage VINT.

The seventh period D7 of the second scan period SS may be inserted subsequent to the fifth period D5 into the second non-light-emitting period P1' before light emission. In the seventh period D7, as the first scan signal GW, the third scan signal GR, and the light-emitting control signal EM are supplied as OFF voltages, and the second scan signal GI is supplied as an ON voltage, the fourth transistor T4 may be turned on and the third node N3 may be initialized to the initialization voltage VINT.

In case that a pixel expresses high gradation according to the embodiments of FIGS. 5 and 6, in the first scan period DS and the second scan period SS, a brightness difference is minimized, and in case that low gradation, for example, 11 gradation to 31 gradation, is expressed, a time taken for a voltage change according to a capacitor charge speed of the organic light-emitting diode becomes longer, and thus, a potential difference in pixel electrode (anode) may be generated. Accordingly, in case that low gradation is expressed, a difference may be generated between the brightness in case that the pixel is driven in the first scan period DS and the brightness in case that the pixel is driven in the second scan period SS. As illustrated in FIG. 10, as the sixth period D6 is inserted into the first scan period DS and the seventh period D7 is inserted into the second scan period SS before light emission, thereby initializing the anode, a voltage change time of the pixel electrode (anode) may be reduced in case that low gradation is expressed.

Figure 11:
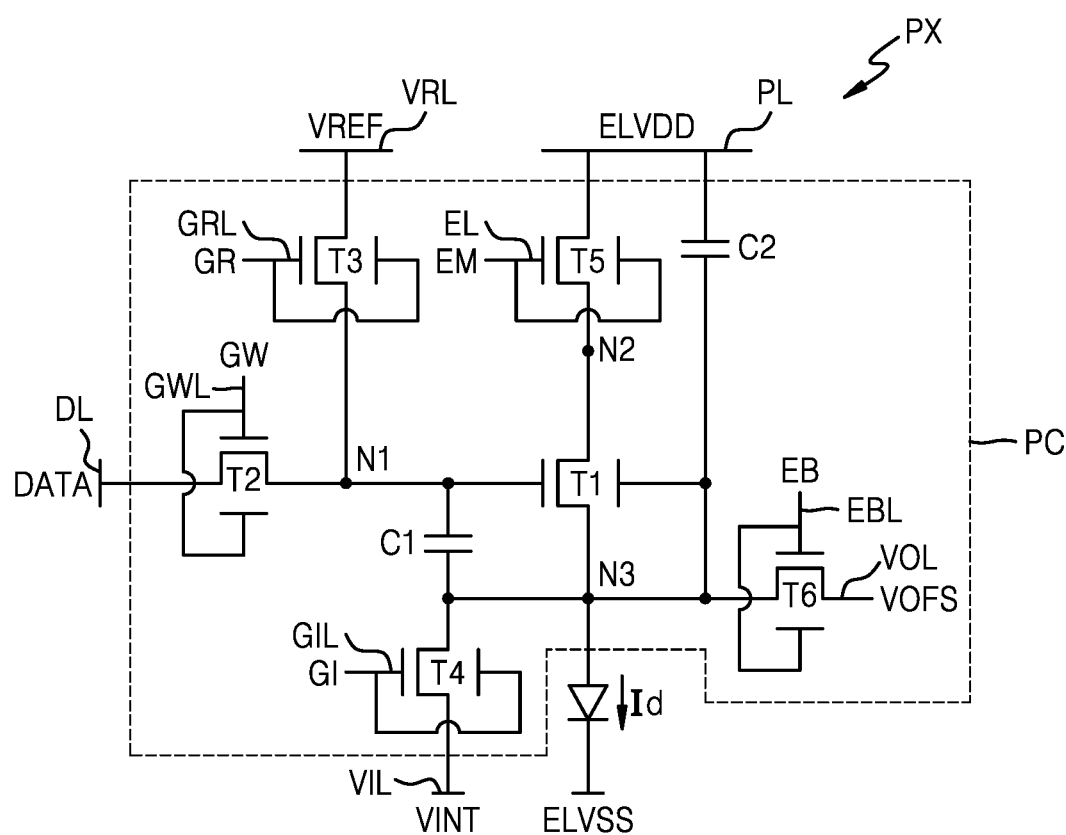
FIG. 11 is a schematic diagram of an equivalent circuit of a pixel circuit of a pixel, according to another embodiment.
Figure 12:
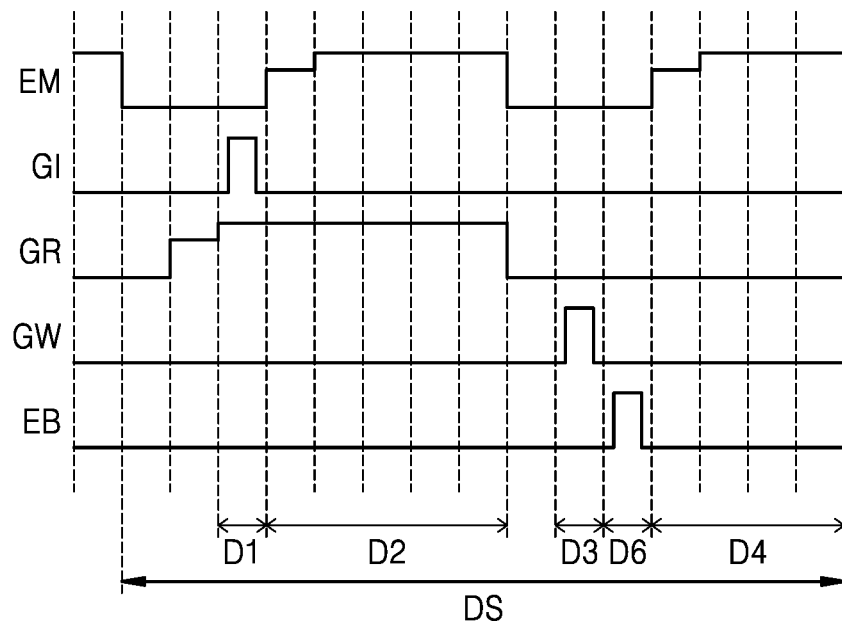
FIGS. 12 and 13 show schematic timing diagrams of control signals to operate the pixel circuit of FIG. 11 in the second driving mode.
Figure 12:
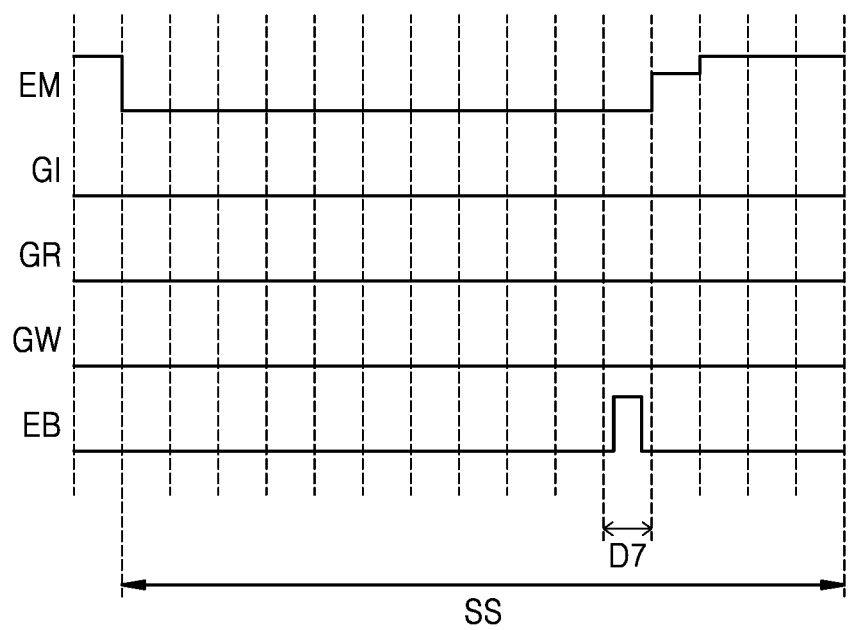
Figure 13:
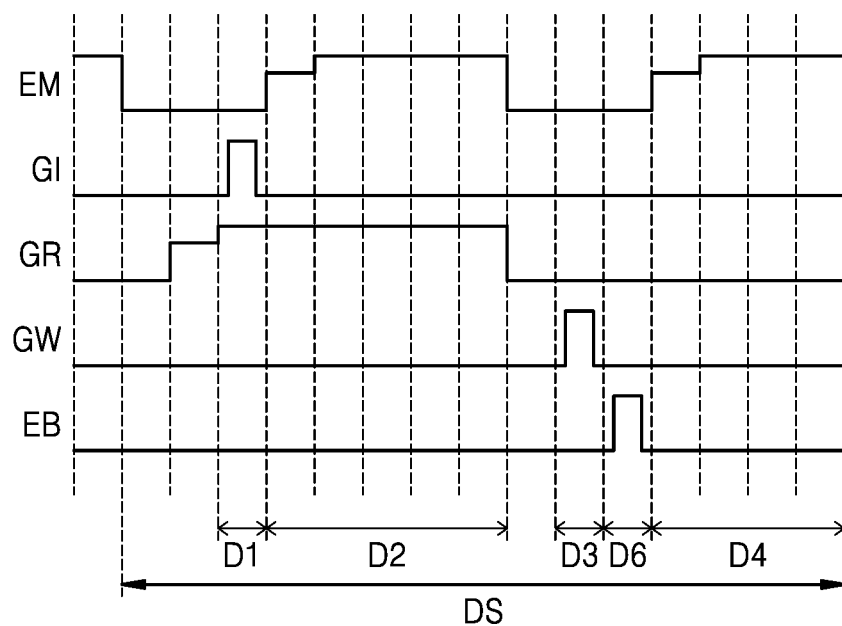
Figure 13:
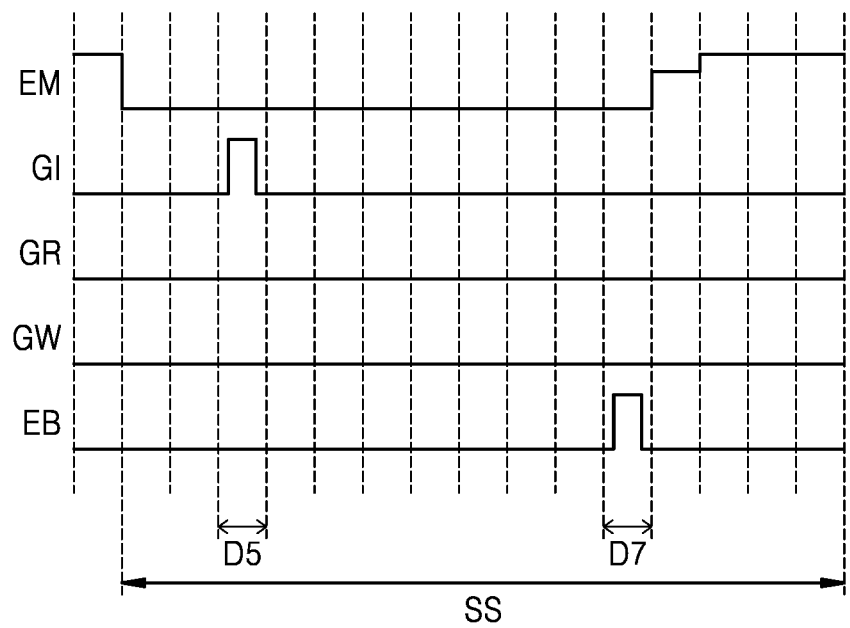

FIG. 11 is a schematic circuit diagram of a pixel circuit PC of a pixel PX, according to another embodiment. FIGS. 12 and 13 illustrate schematic timing diagrams of control signals to operate the pixel circuit PC of FIG. 11 in the second driving mode. In FIGS. 12 and 13, upper timing diagrams are timing diagrams of the first scan period DS, and lower timing diagrams are timing diagrams of the second scan period SS. The timing diagrams of the first scan period DS illustrated in FIGS. 12 and 13 may be applied to the timing diagram of the first scan period DS in the first driving mode.

Referring to FIG. 11, the pixel PX may include an organic light-emitting diode as a display element, and the pixel circuit PC connected to the organic light-emitting diode. The pixel circuit PC may include first to sixth transistors T1 to T6 and first and second capacitors C1 and C2. The pixel circuit PC of the pixel PX illustrated in FIG. 11 is obtained by adding the sixth transistor T6 to the pixel circuit PC of the pixel PX illustrated in FIG. 3. Hereinafter, a detailed description of a same configuration is omitted.

The first transistor T1 may be a driving transistor, and the second to sixth transistors T2 to T6 may be switching transistors. Each of the first to sixth transistors T1 to T6 may be N-channel oxide semiconductor transistor, and each of the first to sixth transistors T1 to T6 may have a first gate and a second gate located to face each other with an oxide semiconductor therebetween.

The sixth transistor T6 (e.g., a reset transistor) is connected between the second terminal of the first transistor T1 and an offset voltage line VOL. The sixth transistor T6 may include the first gate and the second gate connected to a fourth scan line EBL, the first terminal connected to the third node N3 (or the second terminal of the first transistor T1), and the second terminal connected to the offset voltage line VOL. The sixth transistor T6 is turned on according to a fourth scan signal EB transmitted through the fourth scan line EBL to transmit an offset voltage VOFS supplied through the offset voltage line VOL to the third node N3.

Referring to FIG. 2, the pixel part 110 may further include fourth scan lines EBL, and the fourth scan lines EBL may extend in the first direction (for example, a row direction) and be connected to the pixels PX located in a same row. The display apparatus may further include a third gate driving circuit that is connected to the fourth scan lines EBL and provide the fourth scan signal EB to the fourth scan lines EBL. The offset voltage VOFS may be a constant voltage that is the same as the second driving voltage ELVSS or greater than the initialization voltage VINT.

Referring to FIG. 12, the first scan period DS may include the first to fourth periods D1 to D4, and further include the sixth period D6. The second scan period SS may include the seventh period D7. The timing of the sixth period D6 of first scan period DS may be the same as the timing of the seventh period D7 of the second scan period SS. The sixth period D6 and the seventh period D7 may be a bypass period that blocks an inflow of a current to the organic light-emitting diode to allow the organic light-emitting diode to display black.

The sixth period D6 of first scan period DS may be included between the third period D3 and the fourth period D4. The sixth period D6 may be inserted after data writing to a pixel and before light emission. In the sixth period D6, as the first scan signal GW, the second scan signal GI, the third scan signal GR, and the light-emitting control signal EM are supplied as OFF voltages, and the fourth scan signal EB having an ON voltage is supplied through the fourth scan line EBL, the sixth transistor T6 may be turned on. As the sixth transistor T6 is turned on, the third node N3, for example, the pixel electrode of the organic light-emitting diode, may be reset to the offset voltage VOFS.

The seventh period D7 of the second scan period SS may be inserted into the second non-light-emitting period P1' before light emission. In the seventh period D7, as the first scan signal GW, the second scan signal GI, the third scan signal GR, and the light-emitting control signal EM are supplied as OFF voltages, and the fourth scan signal EB having an ON voltage is supplied through the fourth scan line EBL, the sixth transistor T6 may be turned on. As the sixth transistor T6 is turned on, the third node N3, for example, the pixel electrode of the organic light-emitting diode, may be reset to the offset voltage VOFS.

The brightness expressed by the light waveform of the first scan period DS in the second driving mode is less than the brightness expressed by the light waveform of the first scan period DS in the first driving mode. The brightness of the light waveform of the first scan period DS in the second driving mode may be increased by increasing the initialization voltage VINT, which may, however, decrease the gate-source voltage (Vgs) of the first transistor T1 to interfere with threshold voltage compensation, thereby causing a problem of increasing speckles in an image. In case that the reference voltage VREF is increased with the increase of the initialization voltage VINT in order to secure the threshold voltage compensation, the voltage of the third node N3 is changed, and thus, a current flows in the organic light-emitting diode so that black brightness may be increased.

As illustrated in FIG. 12, in the first period D1 of the first scan period DS, the third node N3 is initialized to the initialization voltage VINT, and in the sixth period D6, the third node N3 is reset to the offset voltage VOFS that is higher than the initialization voltage VINT, and thus, in the second driving mode, while securing threshold voltage compensation, the brightness of the light waveform of the first scan period DS may be increased.

In an embodiment, as illustrated in FIG. 13, the second scan period SS may include the fifth period D5 in which the third node N3 is initialized to the initialization voltage VINT with a timing corresponding to in the first period D1 of the first scan period DS, and further include the seventh period D7 in which the third node N3 is reset to the offset voltage VOFS before light emission.

Figure 14:
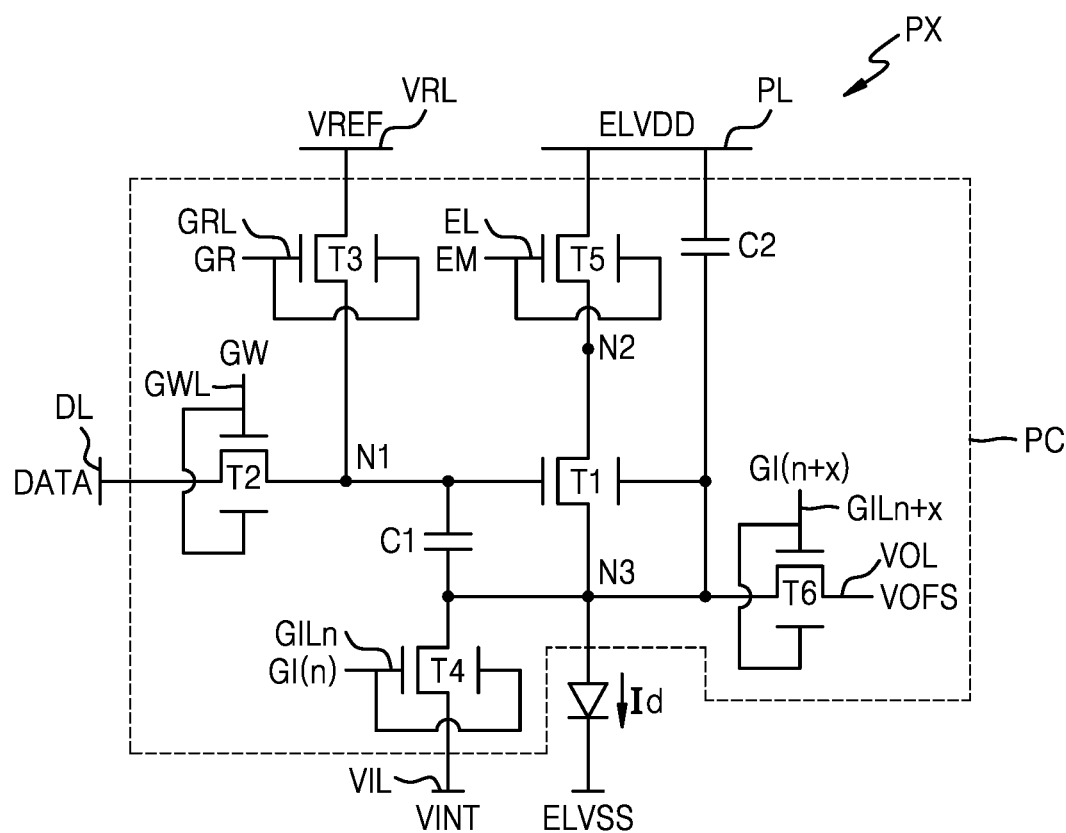
FIG. 14 is a schematic diagram of an equivalent circuit of a pixel circuit of a pixel, according to another embodiment.

FIG. 14 is a schematic circuit diagram of a pixel circuit PC of a pixel PX, according to another embodiment.

The pixel circuit PC of FIG. 14 is different from the pixel circuit PC of FIG. 11 in that the first gate and the second gate of the sixth transistor T6 are connected to the second scan line GIL.

The first gate and the second gate of the sixth transistor T6 are connected to an (n+x)th second scan line (GILn+x) (where x≥3) and may receive an (n+x)th second scan signal (GI(n+x)). Here, x may be a natural number of 3 or more. The driving timing of the pixel circuit PC in the second driving mode illustrated in FIG. 14 is the same as that illustrated in FIG. 6 or FIG. 10. In the embodiment of FIG. 14, as the sixth transistor T6 is turned on or off using the second scan line GIL of a neighboring row (three or more separated neighboring rows), there is no need to provide a separate gate driving circuit to control the sixth transistor T6, and thus, the peripheral area PA may be reduced.

Figure 15:
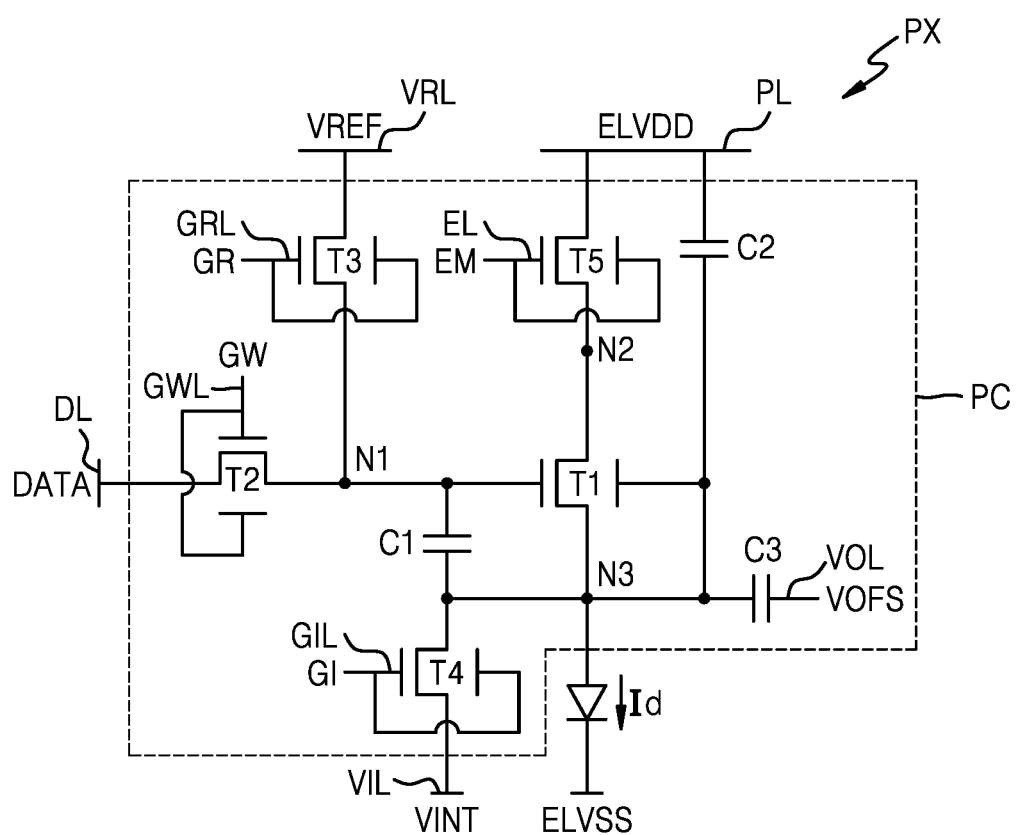
FIG. 15 is a schematic diagram of an equivalent circuit of a pixel circuit of a pixel, according to another embodiment.
Figure 16:
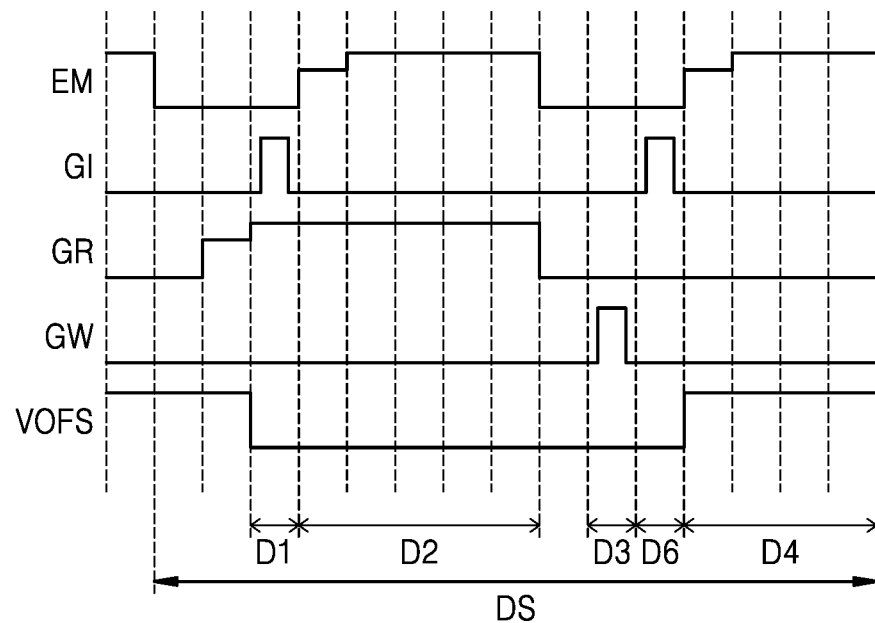
FIG. 16 shows schematic timing diagrams of control signals to operate the pixel circuit of FIG. 15 in the second driving mode.
Figure 16:
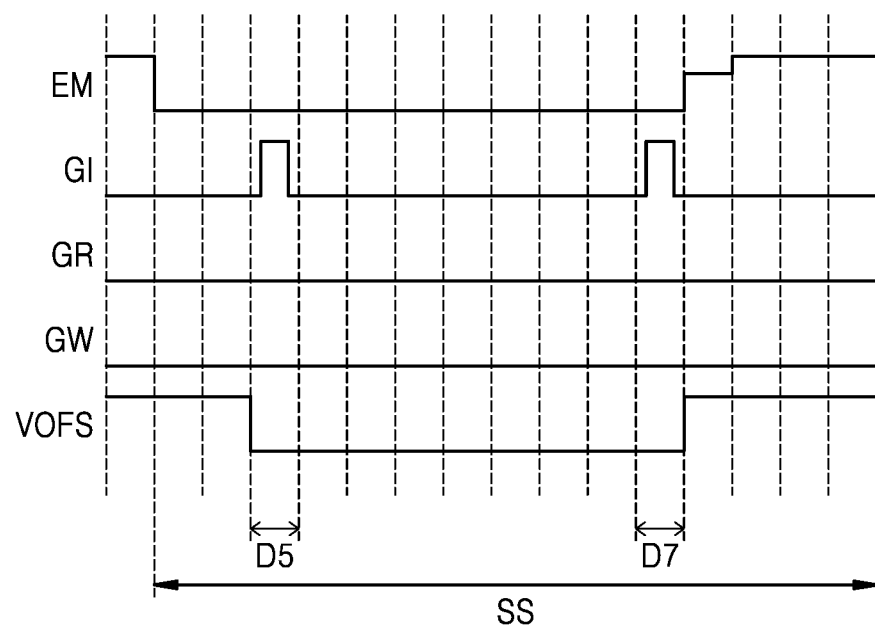

FIG. 15 is a schematic circuit diagram of a pixel circuit PC of a pixel PX, according to another embodiment. FIG. 16 illustrates timing diagrams of control signals to operate the pixel circuit PC of FIG. 15 in the second driving mode. In FIG. 16, an upper timing diagram is the timing diagram of the first scan period DS, and a lower timing diagram is the timing diagram of the second scan period SS. The timing diagram of the first scan period DS illustrated in FIG. 16 may be applied to the timing diagram of the first scan period DS in the first driving mode.

Referring to FIG. 15, the pixel PX may include an organic light-emitting diode as a display element, and the pixel circuit PC connected to the organic light-emitting diode. The pixel circuit PC may include first to fifth transistors T1 to T5 and first to third capacitors C1 to C3. The pixel circuit PC of the pixel PX illustrated in FIG. 15 is obtained by adding the third capacitor C3 to the pixel circuit PC of the pixel PX illustrated in FIG. 3. Hereinafter, a detailed description of a same configuration is omitted.

The third capacitor C3 may be connected between the third node N3 and the offset voltage line VOL. A first terminal of the third capacitor C3 may be connected to the second gate and the second terminal of the first transistor T1, the second terminal of the first capacitor C1, the first terminal of the fourth transistor T4, and the pixel electrode of the organic light-emitting diode. A second terminal of the third capacitor C3 may be connected to the offset voltage line VOL for transmitting the offset voltage VOFS.

Referring to FIG. 16, the first scan period DS may include the first to fourth periods D1 to D4, and further include the sixth period D6. The second scan period SS may include the fifth period D5, and further include the seventh period D7. The timing of the sixth period D6 of first scan period DS may be the same as the timing of the seventh period D7 of the second scan period SS. As the first to seventh periods D1 to D7 are the same as those described with reference to FIG. 10, detailed descriptions thereof are omitted.

The offset voltage VOFS may be an AC voltage that swings between a high-level voltage and a low-level voltage.

The offset voltage VOFS may be shifted from a high level to a low level at a timing in case that the first period D1 of the first scan period DS start or before the start of the first period D1, and shifted from a low level to a high level at a timing at which the sixth period D6 ends or after the end of the sixth period D6. In other words, the offset voltage VOFS may have a pulse width of an ON voltage from the timing at which the first period D1 starts to the timing at which the second period D2, the third period D3, and the sixth period D6 end.

The offset voltage VOFS may be shifted from a high level to a low level at a timing at which the fifth period D5 of the second scan period SS starts or before the start of the fifth period D5, and may be shifted from a low level to a high level at a timing at which the seventh period D7 ends or after the end of the seventh period D7. In other words, the offset voltage VOFS may have the pulse width of an ON voltage from the timing at which the fifth period D5 starts to the timing at which the seventh period D7 ends.

Figure 17:
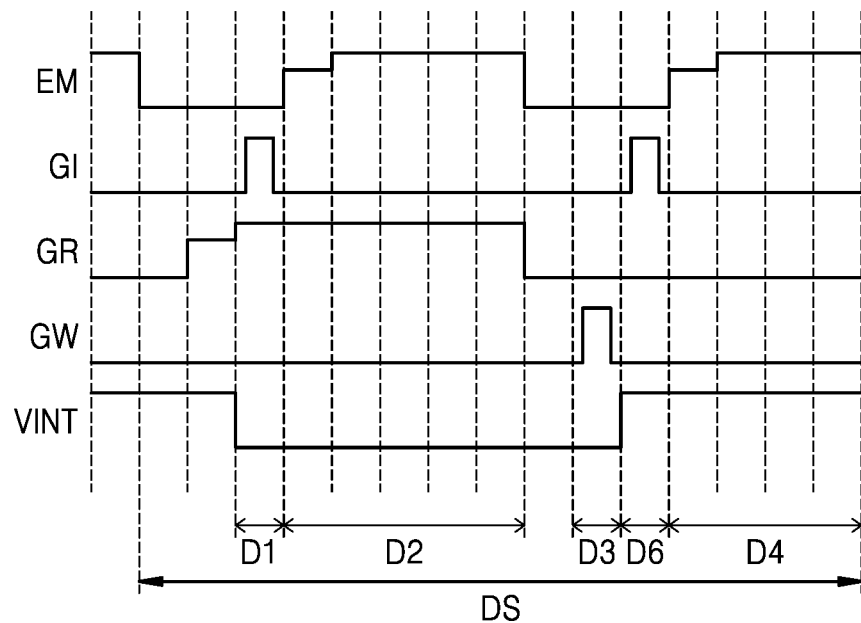
FIG. 17 shows schematic timing diagrams of control signals to operate the pixel circuit of FIG. 3 in the second driving mode, according to an embodiment.
Figure 17:
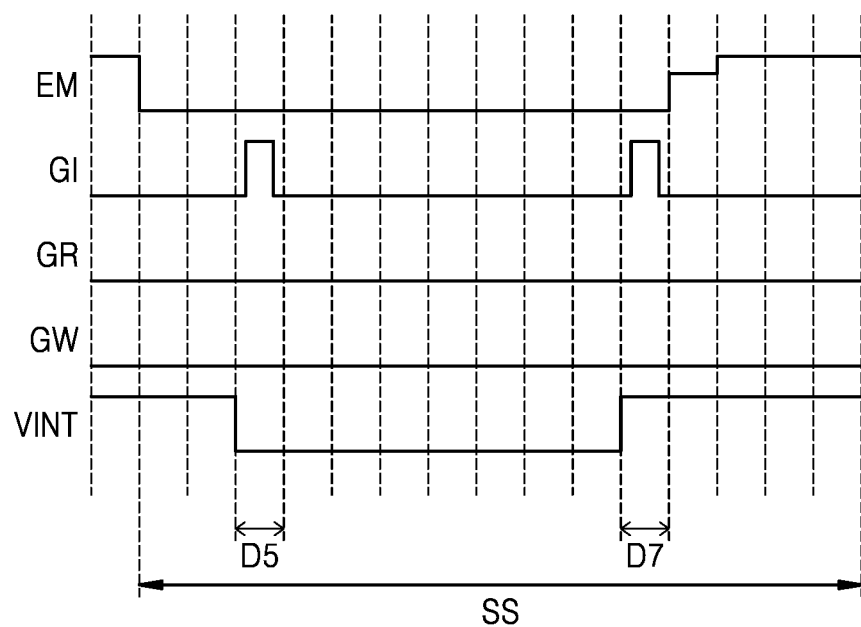

FIG. 17 illustrates schematic timing diagrams of control signals to operate the pixel circuit PC of FIG. 3 in the second driving mode, according to an embodiment. In FIG. 17, an upper timing diagram is the timing diagram of the first scan period DS, and a lower timing diagram is the timing diagram of the second scan period SS. The timing diagram of the first scan period DS illustrated in FIG. 17 may be applied to the timing diagram of the first scan period DS in the second driving mode.

Referring to FIG. 17, the initialization voltage VINT may be an AC voltage that swings between a high-level voltage and a low-level voltage.

The initialization voltage VINT may be shifted from a high level to a low level at a timing at which the first period D1 of the first scan period DS starts or before the start of the first period D1, and may be shifted from a low level to a high level at a timing at which the third period D3 ends or after the end of the third period D3, or at a timing at which the sixth period D6 starts or before the start of the sixth period D6. In other words, the initialization voltage VINT may have the pulse width of an ON voltage from a timing at which the first period D1 starts to a timing at which the second period D2 and the third period D3 end.

The initialization voltage VINT may be shifted from a high level to a low level at a timing at which the fifth period D5 of the second scan period SS starts or before the start of the fifth period D5, and may be shifted from a low level to a high level at a timing at which the seventh period D7 starts or before the start of the seventh period D7. In other words, the initialization voltage VINT may have the pulse width of an ON voltage from the timing at which the fifth period D5 starts to the timing at which the seventh period D7 starts.

Figure 18:
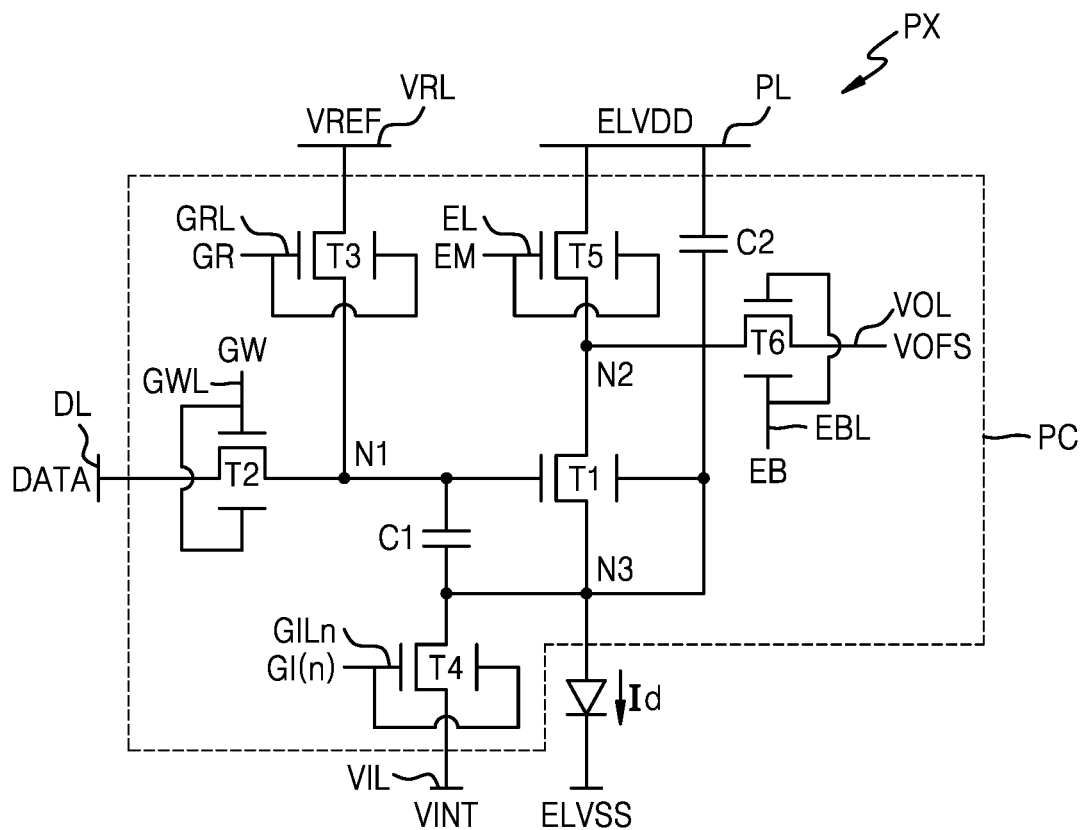
FIG. 18 is a schematic diagram of an equivalent circuit of a pixel circuit of a pixel, according to another embodiment.

FIG. 18 is a schematic circuit diagram of a pixel circuit of a pixel, according to another embodiment.

Referring to FIG. 18, the pixel PX may include an organic light-emitting diode as a display element, and the pixel circuit PC connected to the organic light-emitting diode. The pixel circuit PC may include the first to sixth transistors T1 to T6 and the first and second capacitors C1 and C2. The pixel circuit PC of the pixel PX illustrated in FIG. 18 is obtained by adding the sixth transistor T6 to the pixel circuit PC of the pixel PX illustrated in FIG. 3. Hereinafter, a detailed description of a same configuration is omitted.

The first transistor T1 may be a driving transistor, and the second to sixth transistors T2 to T6 may be switching transistors. Each of the first to sixth transistors T1 to T6 may be an N-channel oxide semiconductor transistor, and each of the first to sixth transistors T1 to T6 may have a first gate and a second gate located to face each other with an oxide semiconductor therebetween.

The sixth transistor T6 is connected between the first terminal of the first transistor T1 and the offset voltage line VOL. The sixth transistor T6 may include a first gate and a second gate connected to the fourth scan line EBL, a first terminal connected to the second node N2 (or the first terminal of the first transistor T1), and a second terminal connected to the offset voltage line VOL. The sixth transistor T6 is turned on according to the fourth scan signal EB transmitted through the fourth scan line EBL to transmit the offset voltage VOFS transmitted through the offset voltage line VOL to the second node N2.

The pixel circuit PC illustrated in FIG. 18 may control the voltage of the anode through the drain-source voltage Vds control of the first transistor T1, by applying a voltage to the drain (the second node N2) of the first transistor T1. The driving timing of the pixel circuit PC illustrated in FIG. 18 in the second driving mode is the same as that illustrated in FIG. 12 or 13.

Figure 19:
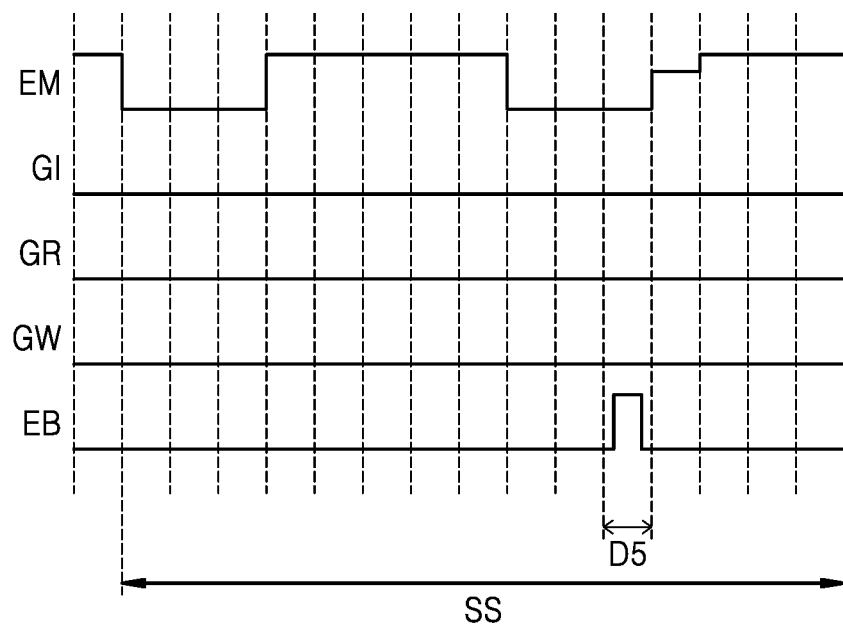
FIG. 19 is a schematic timing diagram of a second scan period SS in the second driving mode, according to an embodiment.

FIG. 19 is a schematic timing diagram of the second scan period SS in the second driving mode, according to an embodiment.

As illustrated in FIG. 19, in the second scan period SS, the light-emitting control signal EM may be supplied as an ON voltage at a timing corresponding to the second period D2 of the first scan period DS. FIG. 19 illustrates an example of a voltage level of the light-emitting control signal EM changed in the second scan period SS illustrated in FIG. 12. The embodiments of the disclosure are not limited thereto, and may be applied to the second scan period SS illustrated in FIGS. 6, 10, 13, 16, and 17 in a substantially identical or similar manner so that the voltage level of the light-emitting control signal EM in the second non-light-emitting period P1' may be changed.

Figure 20:
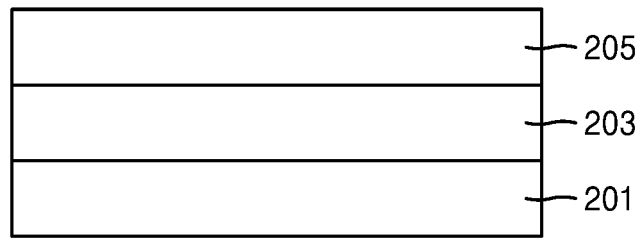
FIG. 20 is a schematic cross-sectional view showing the structure of a display element according to an embodiment.

FIG. 20 is a schematic cross-sectional view illustrating the structure of a display element according to an embodiment. FIGS. 21A to 21D are cross-sectional views illustrating the structures of a display element according to an embodiment.

Referring to FIG. 20, as a display element according to an embodiment, the organic light-emitting diode may include a pixel electrode 201, a counter electrode 205, and an intermediate layer 203 between the pixel electrode 201 (a first electrode or an anode) and the counter electrode 205 (a second electrode or a cathode).

The pixel electrode 201 may include a light-transmitting conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). The pixel electrode 201 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 201 may have a three-layer structure of ITO/Ag/ITO.

The counter electrode 205 may be disposed on the intermediate layer 203. The counter electrode 205 may include a metal having a low work function, an alloy, an electrically conductive compound, or any combination thereof. For example, the counter electrode 205 may include lithium (Li), Ag, Mg, Al, aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The counter electrode 205 may include a transmissive electrode, a semi-transmissive electrode, or a reflective electrode.

The intermediate layer 203 may include a high or low molecular weight organic material that emits light of a color (or a certain or selected color). The intermediate layer 203 may further include, in addition to various organic materials, a metal-containing compound such as an organic metal compound, an inorganic material such as a quantum dot, and the like.

In an embodiment, the intermediate layer 203 may include an emission layer and a first functional layer and a second functional layer respectively disposed below and above the emission layer. The first functional layer may include, for example, a hole transport layer (HTL), or a HTL and a hole injection layer (HIL). The second functional layer may be an optional element to be disposed above the emission layer. The second functional layer may include an electron transport layer (ETL) and/or an electron injection layer (EIL).

In an embodiment, the intermediate layer 203 may include two or more emission parts sequentially stacked each other between the pixel electrode 201 and the counter electrode 205, and a charge generation layer CGL disposed between the two emission parts. In case that the intermediate layer 203 includes an emission part and the charge generation layer CGL, the organic light-emitting diode may be a tandem light-emitting element. The organic light-emitting diode having a stack structure of emission parts may improve color purity and luminous efficiency.

An emission part may include an emission layer and a first functional layer and a second functional layer respectively below and above the emission layer. The charge generation layer CGL may include a negative charge generation layer and a positive charge generation layer. The negative charge generation layer and the positive charge generation layer may further improve the luminous efficiency of the organic light-emitting diode that is a tandem light-emitting element including emission layers.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 21A:
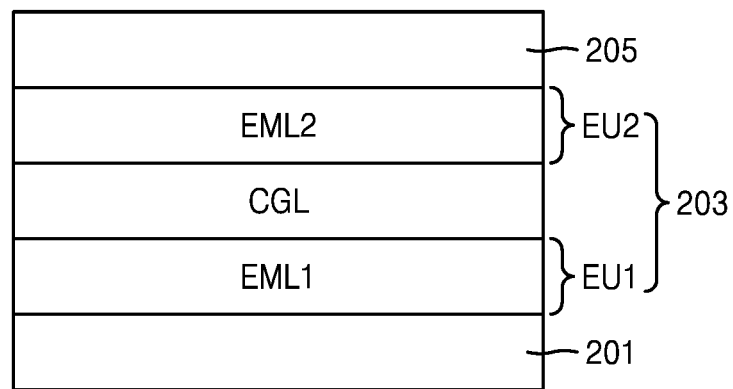
FIGS. 21A to 21D are schematic cross-sectional views showing the structures of a display element according to an embodiment.

In an embodiment, as illustrated in FIG. 21A, the organic light-emitting diode may include a first emission part EU1 including a first emission layer EML1 and a second emission part EU2 including a second emission layer EML2, which are sequentially stacked each other. The charge generation layer CGL may be provided between the first emission part EU1 and the second emission part EU2. For example, the organic light-emitting diode may include the pixel electrode 201, the first emission layer EML1, the charge generation layer CGL, the second emission layer EML2, and the counter electrode 205, which are sequentially stacked each other. The first functional layer and the second functional layer may be respectively disposed below and above the first emission layer EML1. The first functional layer and the second functional layer may be respectively disposed below and above the second emission layer EML2. The first emission layer EML1 may be a blue emission layer, and the second emission layer EML2 may be a yellow emission layer.

Figure 21B:
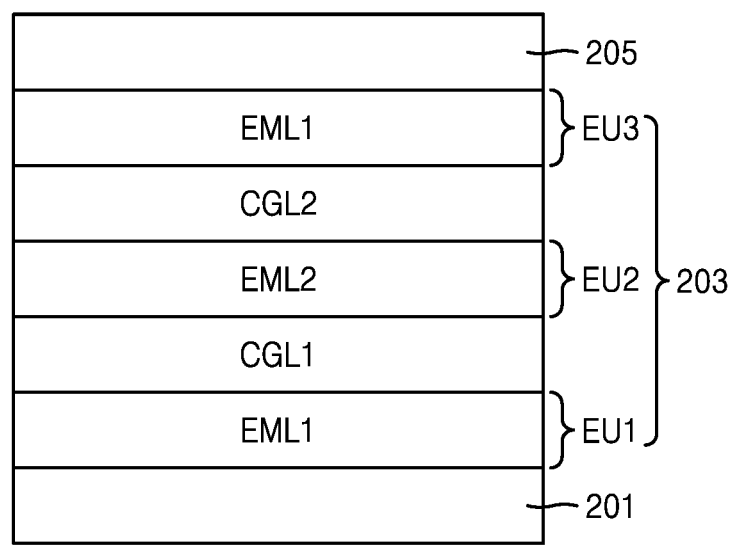

In an embodiment, as illustrated in FIG. 21B, the organic light-emitting diode may include the first emission part EU1 and a third emission part EU3, each including the first emission layer EML1, and the second emission part EU2 including the second emission layer EML2. A first charge generation layer CGL1 may be provided between the first emission part EU1 and the second emission part EU2, and a second charge generation layer CGL2 may be provided between the second emission part EU2 and the third emission part EU3. For example, the organic light-emitting diode may include the pixel electrode 201, the first emission layer EML1, the first charge generation layer CGL1, the second emission layer EML2, the second charge generation layer CGL2, the first emission layer EML1, and the counter electrode 205, which are sequentially stacked each other. The first functional layer and the second functional layer may be respectively disposed below and above the first emission layer EML1. The first functional layer and the second functional layer may be respectively disposed below and above the second emission layer EML2. The first emission layer EML1 may be a blue emission layer, and the second emission layer EML2 may be a yellow emission layer.

In an embodiment, the second emission part EU2 of the organic light-emitting diode may further include, other than the second emission layer EML2, a third emission layer EML3 and/or a fourth emission layer EML4 that directly contacts below and/or above the second emission layer EML2. The direct contact may mean that no other layer is disposed between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 21C:
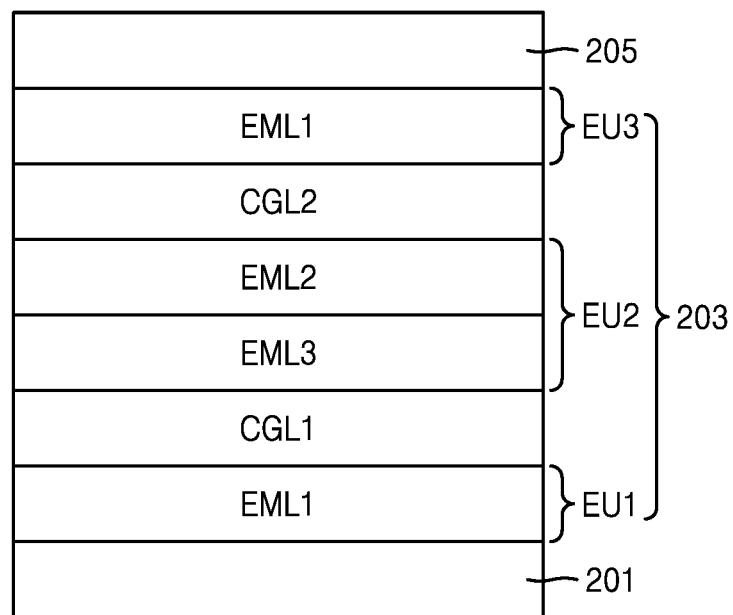

For example, as illustrated in FIG. 21C, the organic light-emitting diode may include the pixel electrode 201, the first emission layer EML1, the first charge generation layer CGL1, the third emission layer EML3, the second emission layer EML2, the second charge generation layer CGL2, the first emission layer EML1, and the counter electrode 205, which are sequentially stacked each other. As another example, as illustrated in FIG. 21D, the organic light-emitting diode may include the pixel electrode 201, the first emission layer EML1, the first charge generation layer CGL1, the third emission layer EML3, the second emission layer EML2, the fourth emission layer EML4, the second charge generation layer CGL2, the first emission layer EML1, and the counter electrode 205, which are sequentially stacked each other.

Figure 21D:
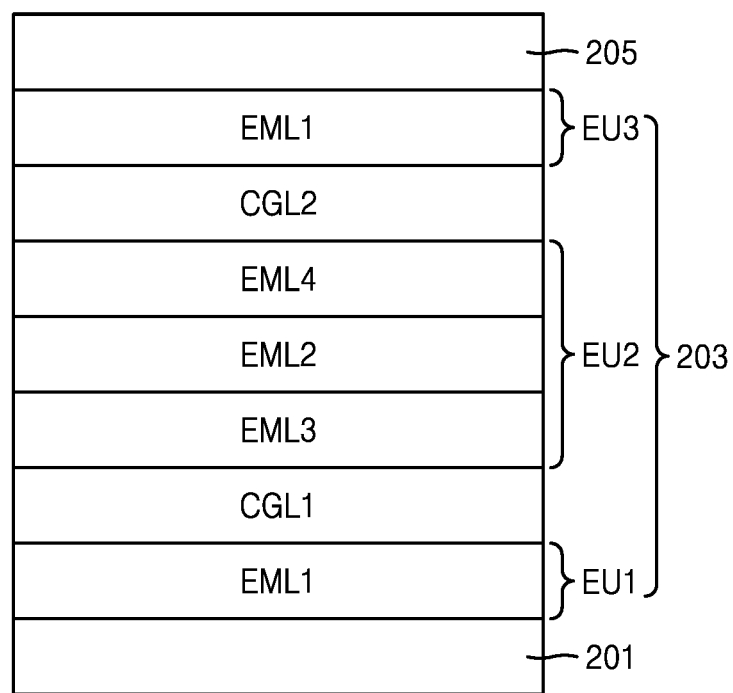
Figure 22A:
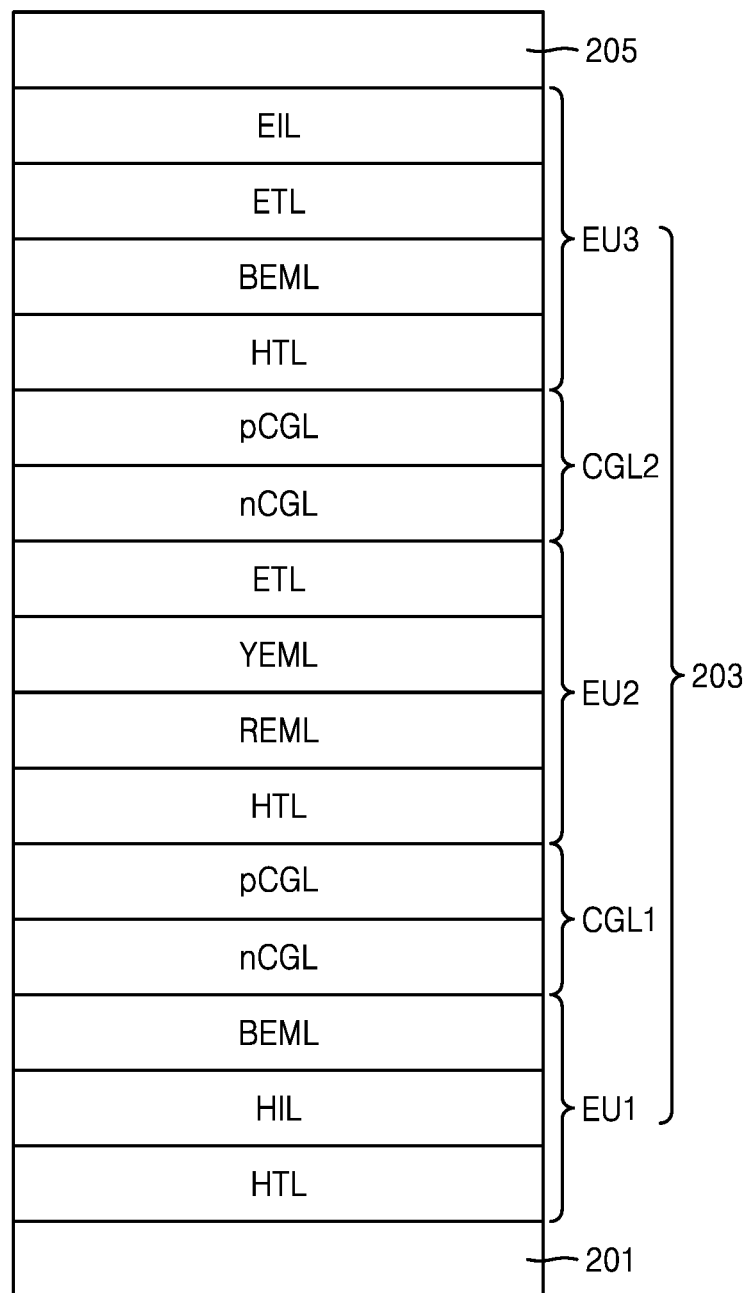
FIG. 22A is a schematic cross-sectional view showing an example of an organic light-emitting diode of FIG. 21C.
Figure 22B:
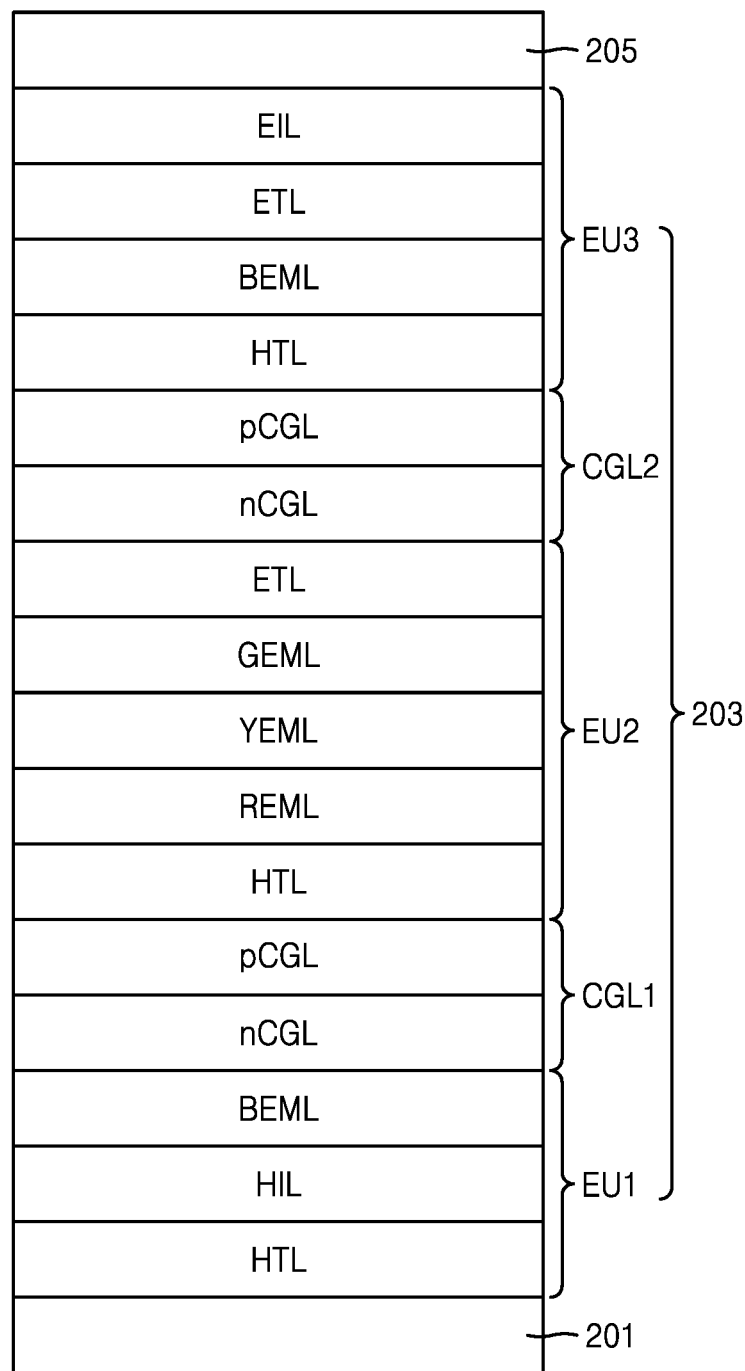
FIG. 22B is a schematic cross-sectional view showing an example of an organic light-emitting diode of FIG. 21D.

FIG. 22A is a schematic cross-sectional view illustrating an example of the organic light-emitting diode of FIG. 21C, and FIG. 22B is a schematic cross-sectional view illustrating an example of the organic light-emitting diode of FIG. 21D.

Referring to FIG. 22A, the organic light-emitting diode may include the first emission part EU1, the second emission part EU2, and the third emission part EU3, which are sequentially stacked each other. The first charge generation layer CGL1 may be provided between the first emission part EU1 and the second emission part EU2, and the second charge generation layer CGL2 may be provided between the second emission part EU2 and the third emission part EU3. Each of the first charge generation layer CGL1 and the second charge generation layer CGL2 may include a negative charge generation layer nCGL and a positive charge generation layer pCGL.

The first emission part EU1 may include a blue emission layer BEML. The first emission part EU1 may further include a hole injection layer HIL and a hole transport layer HTL between the pixel electrode 201 and the blue emission layer BEML. In an embodiment, a p-doping layer may be further included between the hole injection layer HIL and the hole transport layer HTL. The p-doping layer may be formed by doping the hole injection layer HIL with a p-type doping material. In an embodiment, at least one of a blue light auxiliary layer, an electron blocking layer, or a buffer layer may be further included between the blue emission layer BEML and the hole transport layer HTL. The blue light auxiliary layer may increase light output efficiency of the blue emission layer BEML. The blue light auxiliary layer may increase the light output efficiency of the blue emission layer BEML by adjusting hole charge balance. The electron blocking layer may prevent electron injection into the hole transport layer HTL. The buffer layer may compensate for a resonance distance according to the wavelength of light emitted from the emission layer.

The second emission part EU2 may include a yellow emission layer YEML and a red emission layer REML disposed below the yellow emission layer YEML and directly contacting the yellow emission layer YEML. The second emission part EU2 may further include the hole transport layer HTL between the positive charge generation layer pCGL of the first charge generation layer CGL1 and the red emission layer REML, and further include an electron transport layer ETL between the yellow emission layer YEML and the negative charge generation layer nCGL of the second charge generation layer CGL2.

The third emission part EU3 may include the blue emission layer BEML. The third emission part EU3 may further include the hole transport layer HTL between the positive charge generation layer pCGL of the second charge generation layer CGL2 and the blue emission layer BEML. The third emission part EU3 may further include the electron transport layer ETL and an electron injection layer EIL between the blue emission layer BEML and the counter electrode 205. The electron transport layer ETL may be a single layer or a multilayer. In an embodiment, at least one of the blue light auxiliary layer, the electron blocking layer, or the buffer layer may be further included between the blue emission layer BEML and the hole transport layer HTL. At least one of the hole blocking layer or buffer layer may be further included between the blue emission layer BEML and the electron transport layer ETL. The hole blocking layer may prevent hole injection into the electron transport layer ETL.

The organic light-emitting diode illustrated in FIG. 22B are different from the organic light-emitting diode illustrated in FIG. 22A in the stack structure of the second emission part EU2, but other configurations therebetween are the same. Referring to FIG. 22B, the second emission part EU2 may include the yellow emission layer YEML, the red emission layer REML disposed below the yellow emission layer YEML and directly contacting the yellow emission layer YEML, and a green emission layer GEML disposed above the yellow emission layer YEML and directly contacting the yellow emission layer YEML. The second emission part EU2 may further include the hole transport layer HTL between the positive charge generation layer pCGL of the first charge generation layer CGL1 and the red emission layer REML, and further include the electron transport layer ETL between the green emission layer GEML and the negative charge generation layer nCGL of the second charge generation layer CGL2.

Figure 23:
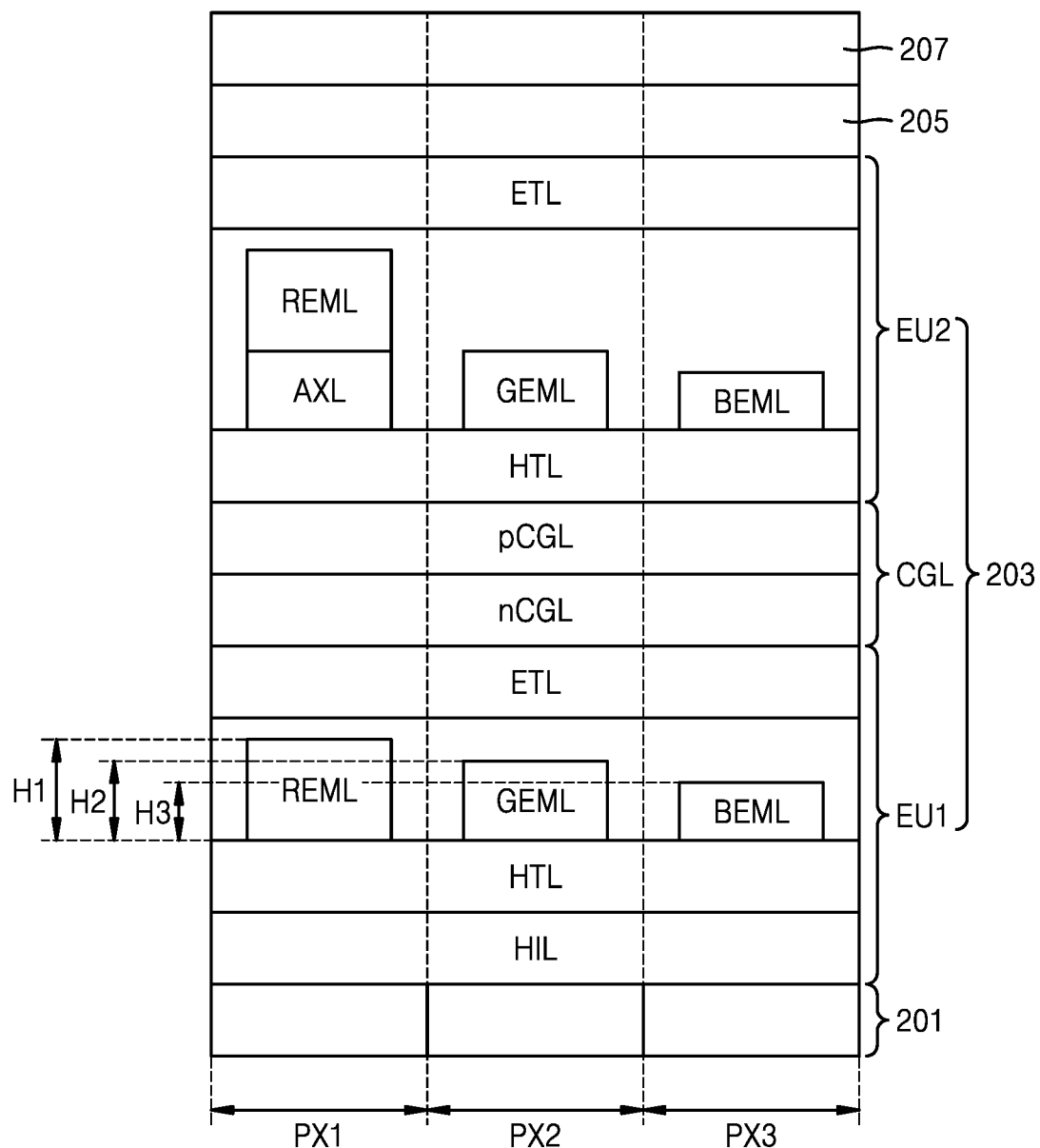
FIG. 23 is a schematic cross-sectional view showing the structure of a pixel of a display apparatus according to an embodiment.

FIG. 23 is a schematic cross-sectional view illustrating the structure of a pixel of a display apparatus according to an embodiment.

Referring to FIG. 23, the display apparatus may include pixels. The pixels may include a first pixel PX1, a second pixel PX2, and a third pixel PX3. Each of the first pixel PX1, the second pixel PX2, and the third pixel PX3 may include the pixel electrode 201, the counter electrode 205, and the intermediate layer 203. In an embodiment, the first pixel PX1 may be a red pixel, the second pixel PX2 may be a green pixel, and the third pixel PX3 may be a blue pixel. Each pixel may include the organic light-emitting diode as a display element, and the organic light-emitting diode of each pixel may be electrically connected to a pixel circuit.

The pixel electrode 201 may be independently provided in each of the first pixel PX1, the second pixel PX2, and the third pixel PX3.

The intermediate layer 203 of the organic light-emitting diode of each of the first pixel PX1, the second pixel PX2, and the third pixel PX3 may include the first emission part EU1, the second emission part EU2, and the charge generation layer CGL between the first emission part EU1 and the second emission part EU2, which are sequentially stacked each other. The charge generation layer CGL may include the negative charge generation layer nCGL and the positive charge generation layer pCGL. The charge generation layer CGL may be a common layer that is continuously formed across the first pixel PX1, the second pixel PX2, and the third pixel PX3.

The first emission part EU1 of the first pixel PX1 may include the hole injection layer HIL, the hole transport layer HTL, the red emission layer REML, and the electron transport layer ETL, which are sequentially stacked each other on and above the pixel electrode 201. The first emission part EU1 of the second pixel PX2 may include the hole injection layer HIL, the hole transport layer HTL, the green emission layer GEML, and the electron transport layer ETL, which are sequentially stacked each other on and above the pixel electrode 201. The first emission part EU1 of the third pixel PX3 may include the hole injection layer HIL, the hole transport layer HTL, the blue emission layer BEML, and the electron transport layer ETL, which are sequentially stacked each other on and above the pixel electrode 201. Each of the hole injection layer HIL, the hole transport layer HTL, and the electron transport layer ETL of the first emission parts EU1 may be a common layer that is continuously formed across the first pixel PX1, the second pixel PX2, and the third pixel PX3.

The second emission part EU2 of the first pixel PX1 may include the hole transport layer HTL, an auxiliary layer AXL, the red emission layer REML, and the electron transport layer ETL, which are sequentially stacked each other on and above the charge generation layer CGL. The second emission part EU2 of the second pixel PX2 may include the hole transport layer HTL, the green emission layer GEML, and the electron transport layer ETL, which are sequentially stacked each other on and above the charge generation layer CGL. The second emission part EU2 of the third pixel PX3 may include the hole transport layer HTL, the blue emission layer BEML, and the electron transport layer ETL, which are sequentially stacked each other on and above the charge generation layer CGL. Each of the hole transport layer HTL and the electron transport layer ETL of the second emission parts EU2 may be a common layer that is continuously formed across the first pixel PX1, the second pixel PX2, and the third pixel PX3. In an embodiment, in the second emission parts EU2 of the first pixel PX1, the second pixel PX2, and the third pixel PX3, at least one of the hole blocking layer or the buffer layer may be further included between the emission layer and the electron transport layer ETL.

A thickness H1 of the red emission layer REML, a thickness H2 of the green emission layer GEML, and a thickness H3 of the blue emission layer BEML may be determined according to the resonance distance. The auxiliary layer AXL is a layer added to meet the resonance distance, and may include a resonance auxiliary material. For example, the auxiliary layer AXL and the hole transport layer HTL may include a same material.

Although FIG. 23 illustrates that the auxiliary layer AXL is provided only in the first pixel PX1, the disclosure is not limited thereto. For example, the auxiliary layer AXL may be provided at least one of the first pixel PX1, the second pixel PX2, or the third pixel PX3 to meet the resonance distance of each of the first pixel PX1, the second pixel PX2, and the third pixel PX3.

The display apparatus may further include a capping layer 207 disposed outside the counter electrode 205. The capping layer 207 may improve luminous efficiency according to the principle of constructive interference. Accordingly, light extraction efficiency of the organic light-emitting diode is increased, and thus, luminous efficiency of the organic light-emitting diode may be improved.

In the specification, supplying a signal (e.g., a certain or selected signal) may mean that an ON voltage, for example, a high-level voltage, is supplied, and not supplying a signal (e.g., a certain or selected signal) may mean that an OFF voltage, for example, a low-level voltage, is supplied.

According to the above embodiments, in a pixel circuit consisting of oxide semiconductor transistors only, by periodically inserting a period for initializing the anode of an organic light-emitting diode at low-frequency driving, a display apparatus in which a brightness difference between driving frequencies is not perceivable at variable-frequency driving may be provided.

According to the embodiment, display apparatuses in which a brightness difference for each driving frequency is reduced during driving of a pixel including oxide semiconductor transistors may be provided.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising a plurality of pixels, each of the plurality of pixels comprising:
    a first transistor;
    a second transistor connected between a gate of the first transistor and a data line, a gate of the second transistor being connected to a first scan line;
    a third transistor connected between the gate of the first transistor and a first voltage line, a gate of the third transistor being connected to a second scan line;
    a fourth transistor connected between a second terminal of the first transistor and a second voltage line, a gate of the fourth transistor being connected to a third scan line;
    a fifth transistor connected between a first terminal of the first transistor and a third voltage line, a gate of the fifth transistor being connected to a control line;
    a first capacitor connected between the gate of the first transistor and the second terminal of the first transistor;
    a second capacitor connected between the third voltage line and the second terminal of the first transistor; and
    an organic light-emitting diode comprising an anode connected to the second terminal of the first transistor.

2. The display apparatus of claim 1, wherein
    each of the plurality of pixels is driven in one first scan period and at least one second scan period during one frame in a driving mode driven at a first driving frequency lower than a maximum driving frequency,
    a third second scan signal is supplied to the third scan line and a control signal is supplied to the control line according to the maximum driving frequency, and
    a first scan signal is supplied to the first scan line and a second scan signal is supplied to the second scan line according to the first driving frequency.

3. The display apparatus of claim 2, wherein in case that the first driving frequency is 1/n of the maximum driving frequency,
    each of a number of the first scan signal supplied to the first scan line and a number of the second scan signal supplied to the second scan line is 1,
    each of a number of the third second scan signal supplied to the third scan line and a number of the control signal supplied to the control line is n, and
    n is a natural number.

4. The display apparatus of claim 2, wherein a timing in which the third scan signal is supplied to the pixel in the first scan period and a timing in which the third scan signal is supplied to the pixel in the second scan period are substantially identical to each other.

5. The display apparatus of claim 2, wherein
    the first scan period comprises a first non-light-emitting period and a first light-emitting period, and
    each of the at least one second scan period comprises a second non-light-emitting period and a second light-emitting period.

6. The display apparatus of claim 5, wherein
the third scan signal is supplied to the third scan line before and after the first scan signal is supplied to the first scan line in the first non-light-emitting period of the first scan period,
the third scan signal is supplied to the third scan line twice in the second non-light-emitting period of the second scan period, and
a timing in which the third scan signal is supplied to the pixel in the first scan period and a timing in which the third scan signal is supplied to the pixel in the second scan period are substantially identical to each other.

7. The display apparatus of claim 5, wherein the first scan period comprises:
a first period in which the second scan signal and the third scan signal each have a gate-on voltage level, and the first scan signal and the control signal each have a gate-off voltage level;
a second period in which the first scan signal and the third scan signal each have a gate-off voltage level, and the second scan signal and the control signal each have a gate-on voltage level;
a third period in which the first scan signal has a gate-on voltage level, and the second scan signal, the third scan signal, and the control signal each have a gate-off voltage level; and
a fourth period in which the first scan signal, the second scan signal, and the third scan signal each have a gate-off voltage level, and the control signal has a gate-on voltage level, and
wherein the fourth period is the first light-emitting period.

8. The display apparatus of claim 7, wherein
the at least one second scan period comprises a fifth period in the second non-light-emitting period, and
in the fifth period, the second scan signal has a gate-on voltage level and the first scan signal, the third scan signal, and the control signal each have a gate-off voltage level.

9. The display apparatus of claim 8, wherein
the control signal is shifted from the gate-off voltage level to the gate-on voltage level twice in the first scan period, and
the control signal is shifted from the gate-off voltage level to the gate-on voltage level once in the second scan period.

10. The display apparatus of claim 8, wherein
the control signal is shifted from the gate-off voltage level to the gate-on voltage level twice in the first scan period, and
the control signal is shifted from the gate-off voltage level to the gate-on voltage level twice in the second scan period.

11. The display apparatus of claim 8, wherein
the first scan period further comprises, between the third period and the fourth period, a sixth period in which the first scan signal, the second scan signal, and the control signal each have the gate-off voltage level, and the third scan signal has the gate-on voltage level, and
the at least one second scan period further comprises, subsequent to the fifth period before the control signal is shifted from the gate-off voltage level to the gate-on voltage level,
a seventh period in which the third scan signal has the gate-on voltage level.

12. The display apparatus of claim 11, wherein
the control signal is shifted from the gate-off voltage level to the gate-on voltage level twice in the first scan period, and
the control signal is shifted from the gate-off voltage level to the gate-on voltage level once in the second scan period.

13. The display apparatus of claim 11, wherein
the control signal is shifted from the gate-off voltage level to the gate-on voltage level twice in the first scan period, and
the control signal is shifted from the gate-off voltage level to the gate-on voltage level twice in the second scan period.

14. The display apparatus of claim 8, wherein each of the plurality of pixels further comprises a third capacitor connected between the anode and a fourth voltage line.

15. The display apparatus of claim 14, wherein a voltage supplied to the fourth voltage line is a voltage supplied to a cathode of the organic light-emitting diode or a voltage greater than a voltage supplied to the second voltage line.

16. The display apparatus of claim 14, wherein
the control signal is shifted from the gate-off voltage level to the gate-on voltage level twice in the first scan period, and
the control signal is shifted from the gate-off voltage level to the gate-on voltage level once in the second scan period.

17. The display apparatus of claim 14, wherein
the control signal is shifted from the gate-off voltage level to the gate-on voltage level twice in the first scan period, and
the control signal is shifted from the gate-off voltage level to the gate-on voltage level twice in the second scan period.

18. The display apparatus of claim 14, wherein
the first scan period further comprises, between the third period and the fourth period, a sixth period in which the first scan signal, the second scan signal, and the control signal each have the gate-off voltage level, and the third scan signal has the gate-on voltage level, and
the at least one second scan period further comprises, subsequent to the fifth period before the control signal is shifted from the gate-off voltage level to the gate-on voltage level,
a seventh period in which the third scan signal has the gate-on voltage level.

19. The display apparatus of claim 18, wherein
a fourth voltage of a low level is supplied to the fourth voltage line from before a start of the first period to after the sixth period in the first scan period,
the fourth voltage of a low level is supplied to the fourth voltage line from before a start of the fifth period to after the seventh period in the at least one second scan period, and
the fourth voltage of a high level is supplied to the fourth voltage line during the first light-emitting period and the second light-emitting period.

20. The display apparatus of claim 18, wherein a timing in which the third scan signal is supplied to the pixel in the first scan period and a timing in which the third scan signal is supplied to the pixel in the second scan period are substantially identical to each other.

21. The display apparatus of claim 1, wherein each of the first transistor to the fifth transistor is an N-channel oxide semiconductor transistor.

* * * * *